United States Patent
Haronian

(10) Patent No.: US 12,003,197 B2
(45) Date of Patent: Jun. 4, 2024

(54) MICRO-ELECTROMECHANICAL DEVICE FOR ENERGY HARVESTING

(71) Applicant: Enervibe Ltd., Hevel Eilot (IL)

(72) Inventor: Dan Haronian, Efrat (IL)

(*) Notice: Subject to any disclaimer, the term of this patent is extended or adjusted under 35 U.S.C. 154(b) by 776 days.

(21) Appl. No.: 17/180,800

(22) Filed: Feb. 21, 2021

(65) Prior Publication Data

US 2021/0203253 A1 Jul. 1, 2021

Related U.S. Application Data

(63) Continuation-in-part of application No. 16/547,574, filed on Aug. 22, 2019, now abandoned, which is a continuation-in-part of application No. 15/567,632, filed as application No. PCT/IB2016/052040 on Apr. 11, 2016, now abandoned.

(60) Provisional application No. 62/230,622, filed on Jun. 11, 2015.

(51) Int. Cl.
*H02N 2/18* (2006.01)

(52) U.S. Cl.
CPC .................. *H02N 2/181* (2013.01)

(58) Field of Classification Search
CPC .... H10N 30/30; H10N 30/302; H10N 30/304; H10N 30/306; H10N 30/308; H02N 2/18; H02N 2/181; H02N 2/183; H02N 2/185; H02N 2/186; H02N 2/188

USPC .......................................................... 310/339
See application file for complete search history.

(56) References Cited

U.S. PATENT DOCUMENTS

| | | | |
|---|---|---|---|
| 2002/0014660 A1 | 2/2002 | Noble et al. | |
| 2004/0197227 A1 | 10/2004 | Hauan et al. | |
| 2004/0253787 A1 | 12/2004 | Lee et al. | |
| 2005/0093380 A1 | 5/2005 | LaFollette et al. | |
| 2006/0202592 A1* | 9/2006 | Ruggeri | H02N 2/186 310/349 |
| 2007/0114890 A1* | 5/2007 | Churchill | H10N 30/306 310/339 |
| 2011/0140577 A1 | 6/2011 | Galchev | |
| 2012/0161583 A1* | 6/2012 | Kang | H10N 30/30 310/339 |
| 2013/0106497 A1 | 5/2013 | Lutz et al. | |
| 2014/0352775 A1 | 12/2014 | Ku Doh et al. | |
| 2015/0094786 A1 | 4/2015 | Deterre | |

* cited by examiner

*Primary Examiner* — Derek J Rosenau

(57) ABSTRACT

A device for converting mechanical energy to electrical energy that include a mechanical device comprising a seismic mass flexibly connected to a base by at least one spring, a mechano-electric transducer that is associated with the mechanical device for converting mechanical energy of the seismic mass to electric energy, and an electric circuit that is connected to the mechano-electric transducer in a way that electric current is generated in the electric circuit when the seismic mass moves relative to the base. The mechano-electric transducer is designed to adjust a force that the mechano-electric transducer can exert on the mechanical device and by that to control the conversion level of the mechanical energy to the electrical energy.

6 Claims, 32 Drawing Sheets

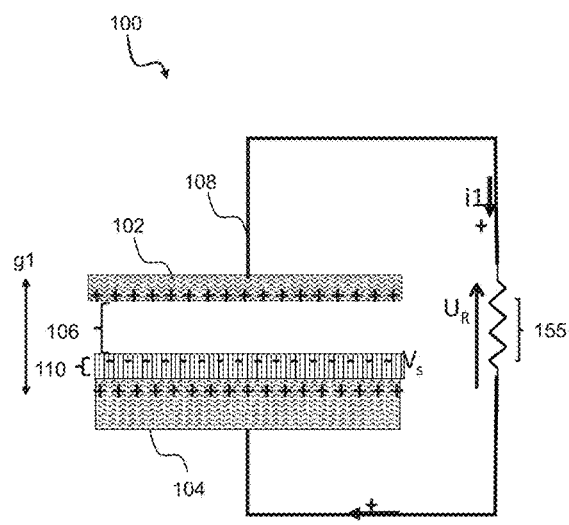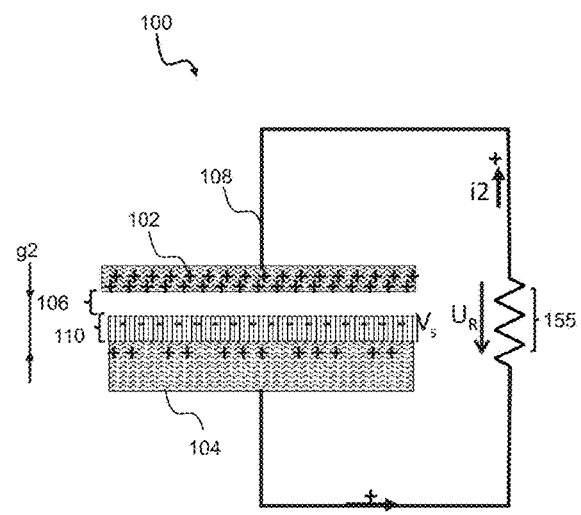
FIG. 1A
(Prior Art)
FIG. 1B
(Prior Art)

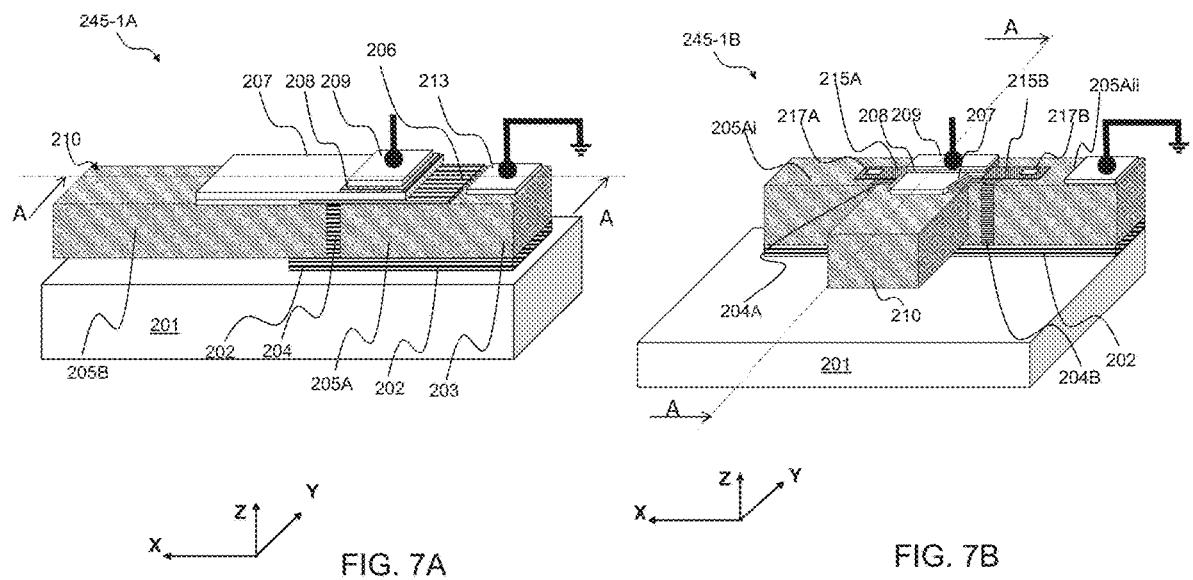

MICRO-ELECTROMECHANICAL DEVICE FOR ENERGY HARVESTING

CROSS-REFERENCE TO RELATED APPLICATIONS

This application is a continuation in part of U.S. patent application Ser. No. 16/547,574 filed on Aug. 22, 2019 which is a continuation in part of U.S. patent application Ser. No. 15/567,632 filed on Oct. 19, 2017 which claims priority from PCT Patent Application No. PCT/Ib2016/052040 having International filing date of 11 Apr. 2016, which claims the benefit of priority under 35 USC § 119(e) of U.S. Provisional Patent Application No. 62/230,622 filed on 11 Jun. 2015. The contents of the above applications are all incorporated by reference as if fully set forth herein in their entirety.

TECHNICAL FIELD

The present disclosure relates to micro-electromechanical systems, devices and methods for harvesting electrical energy from mechanical movements and displacement sensors.

BACKGROUND

Many types of energy harvesters that convert mechanical energy to electrical energy are known in the art. The known harvesters include a mechanical device that comprises a seismic mass that is connected flexibly to a base (or a body) by a spring, AND a mechano-electric transducer that converts the mechanical energy of the seismic mass to electric energy. Also, there are many types of mechano-electric transducer that known in the art. When the mechano-electric transducer converts the mechanic energy of the seismic mass to electric energy the movement of the seismic mass is damped due to a force that the mechano-electric transducer exerts on the mechanical device. The energy harvester of the present invention include an innovative mechano-electric transducer that is designed to control the magnitude the damping by controlling the force that the mechano-electric transducer itself exerts on the mechanical device, and by that to control the conversion level of the mechanical energy to the electrical energy.

None of the prior art publications nor US PGPub 2015/0094786A1 (hereinafter Deterre) reveals any energy harvester with mechano-electric transducer that is designed to control the magnitude force that the mechano-electric transducer itself exerts on the mechanical device. Deterre discloses an energy harvester that is designed to convert mechanical energy (vibrations caused by the heartbeat of a living creature, animal of human) to electrical energy. The problem is that the heartbeats create a very low vibrational frequency which does not enable an efficient mechano-electric harvesting from the mass that is attached to the vibrating body of the living creature. The invention of Deterre is to use TWO seismic masses: a first one that he named as the "primary oscillating structure" (60) and a second one that he named as "secondary oscillating structure" (70) (see Deterre paragraphs [0013]-[0016] and [0065]). Then Deterre converts the low level frequency vibrations of the primary oscillating structure to high level frequency vibrations in the secondary oscillating structure. For achieving this conversion of low level frequency vibrations to the high level frequency vibrations Deterre attached to the primary oscillating structure series of electrodes 82 and to the secondary oscillating structure series of electrodes 84. By charging these two set of electrodes electrodes 82 attract electrodes 84 and causes them together with the secondary oscillating structure (70) to vibrate at a higher frequency (see for example FIGS. 8 and 10 of Deterre).

After that, Deterre harvest the vibration of the Secondary oscillating structure (70) in the standard known ways in the art, means, that he couples a standard mechano-electric transducer that converts the mechanical energy of the Secondary oscillating structure to electric energy. The energy harvester of Deterre does not include a mechano-electric transducer that is designed to control the magnitude force that the mechano-electric transducer itself exerts on the mechanical device (the Secondary oscillating structure), as a contrary to the disclosed energy harvesters that the innovative mechano-electric transducer that controls the magnitude force that the mechano-electric transducer itself exerts on the mechanical device, and by that controls the conversion level of the mechanical energy to the electrical energy.

We would like to emphasis that the mechano-electric transducer of the device subject matter of the present invention is designed to control the magnitude force that the mechano-electric transducer itself exerts on the mechanical device and this control is achieved due to the structure of the mechano-electric transducer itself. On the other hand, the mechano-electric transducer of Dettere that is associated with the Secondary oscillating structure (70) is a standard known type that does not have any ability to control the magnitude force that it exerts on the Secondary oscillating structure (70) (nor on the Primary oscillating structure (60)). In FIG. 4 and the relevant part of the specification we explain in details how to control (change) the magnitude force when the mechano-electric transducer is of the electromagnetic mechano-electric transducer type, in FIG. 5A when the mechano-electric transducer is of the piezoelectric mechano-electric transducer type, and in FIG. 6D when the mechano-electric transducer is of the electrostatic mechano-electric transducer type.

Micro-electromechanical devices and systems utilize piezoelectric, electromagnetic or electrostatic converters for converting mechanical movement into electrical energy.

As shown schematically in FIGS. 1A and 1B, a known electrostatic converter 100 has a variable capacitor structure comprising a first and a second capacitor plate 102 and 104 separated by a dielectric 106 (e.g., air) and which are conductively coupled with each other over a conductor 108 having a resistivity or load 155 having an impedance Z. An electret layer 110 is formed on, or constitutes either first capacitor plate 102 or second capacitor plate 104 such as to face the other plate. The electret can be made of $SiO_2$ and is charged with electrons, for example, by using corona. Further, first and/or second capacitor plates 102 and 104 are mounted to allow alternatingly retracting and approaching movements which, in turn, induces alternating (AC) electric current in conductor 108. Relative retracting and approaching movements of first and second capacitors plates 102 and 104 are schematically illustrated by arrows g1 and g2. For example, first capacitor plate 102 may be moveably mounted (e.g., suspended) to allow its displacement responsive to mechanical vibrations in approaching and retracting directions g1 and g2 relative to second capacitor plate 104 which may be fixed in space. Another possibility is a device configuration in which the gap between the electrodes remains substantially constant, yet which oscillate sideways so that the amount of electrodes overlap changes periodically. The induced AC may be rectified by rectifier circuitry to generate a direct current (DC), e.g., for charging batteries or powering an electrical device.

If a distance between first and second plates 102 and 104 due to relative displacement in direction G1 is large enough, the charge on the capacitors is redistributed and the electric current flows as schematically illustrated in FIG. 1A by arrow i1. Conversely, if a distance between first and second plates 102 and 104 decreases due to relative approaching displacement in direction D2, then the electric current flows as schematically illustrated in FIG. 1B by arrow i2.

Electrostatic converters that employ electrets are disclosed exemplarily by T. Tsutsumino, Y. Suzuki, N. Kasagi, K. Kashiwagi, Y. Morizawa in "Efficiency Evaluation of Micro Seismic Electret Power Generator", Proceedings of the 23rd Sensor Symposium 2006, Takamatsu, pp. 521-524; by Ma Wei, Zhu Ruiqing, Rufer Libor, Zohar Yitshak, Wong Man in "An integrated floating-electrode electric microgenerator", Journal of microelectromechanical systems, v. 16, (1), 2007, February, p. 29-37; and in U.S. Pat. No. 8,796,902 to TATSUAKIRA et al. titled "Electrostatic Induction Power Generator". The lifetime of a known electrostatic converter such as converter 100 depends, inter alia, on the charge stability implanted inside the electret.

US publication 20170373611A (Cottone), US publication 6597048 (Ken) and JP2008200758 publication (Sato) disclose a miniature kinetic energy harvester, an electrostatically charged microstructure and MEMS element, and none of them include a mechanoelectric transducer that is deigned to adjust its mechanoelectrical property to a desired level.

Cottone et. al. in patent application US20170373611A discuss an electrostatic energy harvester for generating electrical energy from mechanical vibrations. FIG. 2A (FIG. 1 in Cottone) shows a general description of Cottone invention. The invention relates to a miniature kinetic energy harvester 1 for generating electrical energy, comprising: a support 2, a first element 3 having walls 32-35 surrounding at least one cavity 31, at least one spring (4) mounted between the first element 3 and the support 2, the spring 4 being arranged so that the first element 3 may be brought into oscillation relative to the support 2 according to at least one direction (X) of oscillation, a transducer 5 arranged between the first element 3 and the support 2 for converting oscillation of the first element 3 relative to the support 2 into an electrical signal, at least one second element 7 housed within the cavity 31 and mounted to freely move within the cavity 31 relative to the first element 3 so as to impact the walls 32-35 of the cavity 31 when the harvester 1 is subjected to vibrations.

In FIG. 2B, Cottone (FIG. 5 in Cottone) shows a voltage source Vo for pre-charging the device. The voltage is connected between the first element 3 and the transducer 5 and therefore first element and the transducer are electrically connected to each other.

It is noted that in Cottone element 7 is a free to move inside a cavity within first element 3 such that at low vibration frequencies it hits element 3 and thus induces movement of element 3 relative to transducer 5 that generates of electrical power on the load RL as shown in FIG. 2B.

Ken in patent application U.S. Pat. No. 6,597,048B1 discusses Electrostatically charged microstructures. FIG. 2C shows a general description of Ken's invention. This invention is about a process and apparatus for injecting electrostatic charges into opposing elements of MEMS structures to produce repulsing forces between the elements. These forces tend to produce controlled spacing between components to prevent sticking and to provide friction-free relative movement.

Sato in JP2008200758-A refers to a MEMS element, A general view of this invention is shown in FIG. 2D. Here A capacitor is formed between movable electrode 13 and a fixed electrode 16. Movable electrode 13 has fixed side 17 end with movable side 18. A floating gate 2 is placed along electrode 13 and at close proximity such that when the floating gate is charged the charges induces a force on a movable side of the electrode 18 and thus change the gap between the movable side 18 of the electrode and electrode 16 thus change its capacitance. In the prior art described in this invention, whenever related to energy harvesting, do not related the transducer properties to the mechanical excitation.

The description above is presented as a general overview of related art in this field and should not be construed as an admission that any of the information it contains constitutes prior art against the present patent application.

SUMMARY

The present invention refers to a device for converting mechanical energy to electrical energy, comprising a mechanical device comprising a seismic mass flexibly connected to a base by a spring, and a mechanoelectric transducer that is associated with the mechanical device for converting the mechanical energy to the electric energy, such that the mechanoelectric transducer is deigned to adjust its mechanoelectrical property to a desired level. The transducer terminals are connected to an electric circuit, such that when the seismic mass moves relative to the base an electric current is generated in the electric circuit.

The device for converting mechanical energy to electrical energy as stated above can be relised using different transducers. For example it can be realised by an electrostatic transducer that comprises a capacitive structure made of first and second electrode at close proximity. The first electrode is mounted on the seismic mass and a second electric electrode is mounted on a support. The capacitor is charged by a charging device to a level such that the electrostatic force that is developing between the two electrodes yield an optimal mechanical to electrical energy conversion. Details of such optimal conversion is given below. The charging device is connected to the first electrode through an electric disconnecting mechanism such that the charging device is electrically connected to the electrode only while charging in order to avoid charge leakage.

Another example for implementing an adjustable transducer is to use a piezoelectric transducer that is fixed to a bending spring with seismic mass fixed to its free end. The piezoelectric transducer is comprised of plurality of piezoelectric transducers units that may be connected or disconnected such that the overall piezoelectric constant of the piezoelectric transducer may be modified such that the force applied by the piezoelectric transducer on the bending spring can be controlled in order to optimize the mechanical to electrical power conversion.

A third example for an adjustable transducer may use a magnet that is fixed to the seismic mass and an inductor that is made of conductive coil (inductor), placed at close proximity to the magnet. The two ends of the coil may be connected to a load such that when the seismic mass and the magnet move relative to the coil current is induced in the coil. The length of the wire in the coil is adjustable, for example by having one of the wires ends comprised of a slider that slides along the coil. By changing the length of the coil, or the distance between the coil and the magnet, the magnetic force generated by the currant flowing in the coil that opposes the magnetic field of the magnet can be controlled and by that to control the mechanoelectric coupling between the DEVICE and transducer such that the electric power in the inductor may be tuned to an optimal value.

The device for converting mechanical energy to electrical energy as stated above, may further includes a power management circuit for converting the electric current to DC power so that the device can be used for energy harvesting. In addition, the device may further include a secondary electric circuit for adjusting the desired level of mechanoelectrical property such that the electric current can be adjusted. This device may further include a power management circuit that transform the electric current to a DC power source for powering the secondary electric circuit.

The device for converting mechanical energy to electrical energy as stated above, may also use the value of the electric current to represent the movement of the device. The device may also be used as inertial sensor.

BRIEF DESCRIPTION OF THE FIGURES

The figures illustrate generally, by way of example but not by way of limitation, various embodiments discussed in the present disclosure.

For simplicity and clarity of illustration, elements shown in the figures have not necessarily been drawn to scale. For example, the dimensions of some of the elements may be exaggerated relative to other elements. Furthermore, reference numerals may be repeated among the figures to indicate corresponding or analogous elements. The figures are listed below.

FIG. 1A is a schematic circuit diagram illustration of a DEVICE showing using transducer based on charged electret, as known in the art;

FIG. 1B is a schematic circuit diagram illustration of the DEVICE showing approaching electrode, as known in the art;

FIG. 2A FIG. 1 from Prior art by Cottone;
FIG. 2B FIG. 5 from Prior art by Cottone;
FIG. 2C FIG. 2 from Prior art by Kan;
FIG. 7A is a schematic perspective side view illustration of a FGCD charging arrangement, according to an embodiment;
FIG. 7B is a schematic perspective front view illustration of a FGCD charging arrangement, according to another embodiment.

DETAILED DESCRIPTION

Figure 2A:
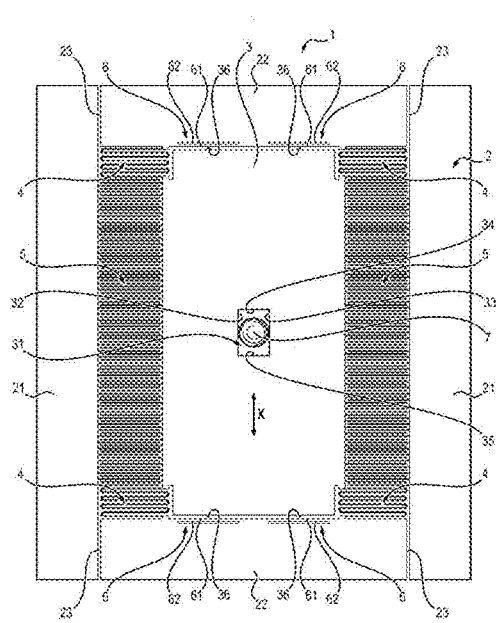
Figure 2B:
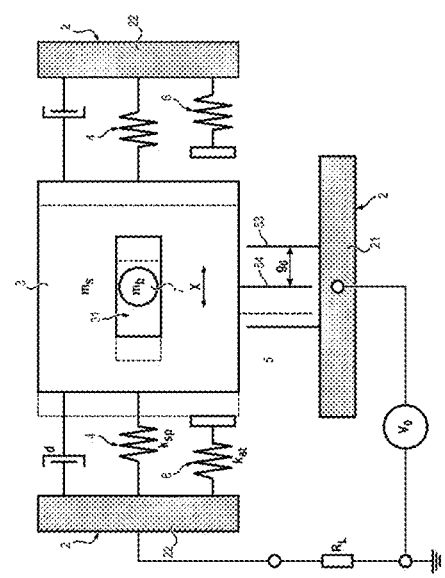
Figure 2C:
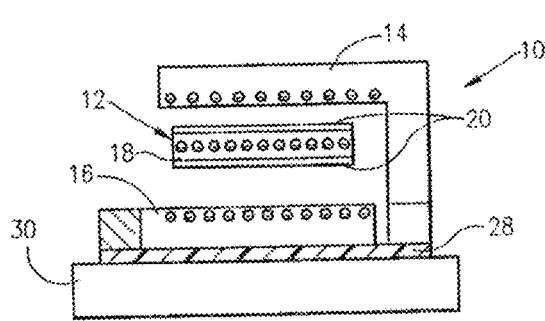
Figure 2D:
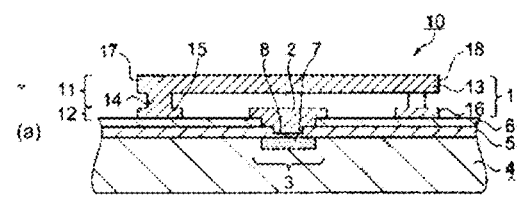
FIG. 2D From prior art by Sato.
Figure 2D:
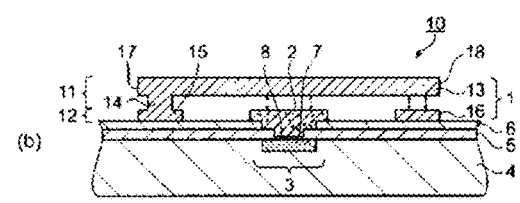

The following description of a device for converting mechanical energy to electrical energy (DEVICE), systems and methods for energy harvesting and/or sensing is given with reference to particular examples, with the understanding that such devices, systems and methods are not limited to these examples.

The expression "energy harvesting" as used herein, as well as grammatical variations thereof, refers to the conversion of mechanical motion into electric energy. Such mechanical motion may the result of acceleration and/or vibration on a DEVICE according to embodiments.

Accordingly, a DEVICE according to an embodiment may function as a displacement sensor or inertial sensor. Vibrations may be periodic or random or result from forces such as Coriolis force in DEVICE used as a gyroscope. In some embodiments, a DEVICE may be employed for energy harvesting. Sensed mechanical motion may be desirable or undesirable ("wasting energy"). Sources of undesirable vibration include, for example, vibrational motions of engines, friction, movement of a tire on a road, walking, mammalian organ and vascular movement, etc.

A DEVICE includes according to some embodiments a seismic mass suspended over a spring, a transducer that converts mechanical energy into electrical energy and a circuit that uses the electrical energy converted by the transducer. The energy may be used for many applications including energy harvesting, vibration sensing, or inertial sensing including acceleration and velocity through some gyroscope architecture.

Typically, the transducer of an energy harvesting or for sensing is based on piezoelectric effect, electrostatic or electromagnetic induction. The efficiency of the power conversion is a function of several parameters, including the weight of seismic mass, the vibration applied, the resonance frequencies of the spring mass system, the parasitic damping, and the magnitude of the mechano-electric coupling (MEC). The MEC has the same effect as the damping force by friction and may be referred to as "electric damping force," where mechanical energy is converted into electricity instead of to heat. For example, in piezoelectric transducer, the electric damping is $k_e^2$ which is the electromechanical coupling coefficient, in elect traducer the MEC is related to the charge density on the electrode, and in electromagnetic transducer it is related to the magnetic force induced by a magnet and by current flowing in a coil or inductor.

The electric power that is converted into electricity is described analytically in the equation (1):

$$P_e = \frac{1}{2}D\dot{X}^2 = \xi_e m \omega_n \dot{X}^2 \qquad (1)$$

$$P_e = \frac{\xi_e r^2 m \omega^3 Y_0^2}{(1-r^2)^2 + [2(\xi_e + \xi_p)]^2}$$

Where $$r = \frac{\omega}{\omega_n}, \xi_e = \frac{D_e}{2m\omega_n}, \xi_p = \frac{D_p}{2m\omega_n}, Q = \frac{1}{2(\xi_e + \xi_p)}$$

$\xi_p$ is the mechanical damping, $\xi_e$ is the MEC (electrical damping) $\omega$ is the vibration frequency, and $\omega n$ is the mass-spring resonance frequency.

It is evident from equation (1) that the harvested power is zero when MEC is zero or at infinity. Therefore, it may be understood that there is a preferred value between MEC=0 and MEC=infinity where the power is at maximum. This optimal value of MEC is different for different vibration frequency and for different mechanical damping. In addition, not indicated in the equations above, for a given MEC the vibration amplitude of the seismic mass-spring system may become high to the point where the seismic mass hits a stopper. Such a stopper is found in most Vibration Energy Harvesters or sensors such as accelerometers and are designed to prevent the seismic mass vibration amplitude to exceed a level that may damage the device. By adjusting the MEC it is possible to control the amplitude of movement of the seismic mass such that the converted power is optimized while minimizing the mechanical damage.

The MEC of state-of-the-art Energy harvesters or sensors transducer is fixed. In piezoelectric this is a piezoelectric constant which is a result of the piezoelectric material and of the dimensions that is deposited on the flexing part of the DEVICE. In electrostatic based DEVICE, this is the charge density that is created on the electret, typically using corona. In electromagnetic based DEVICE, it is the induction constant that results from the magnetic strength and the inductor.

This invention is related to DEVICE where the MEC of the transducer can be adjusted such that power generated is optimized or such that the vibration amplitude of the seismic mass is controlled.

Figure 3A:
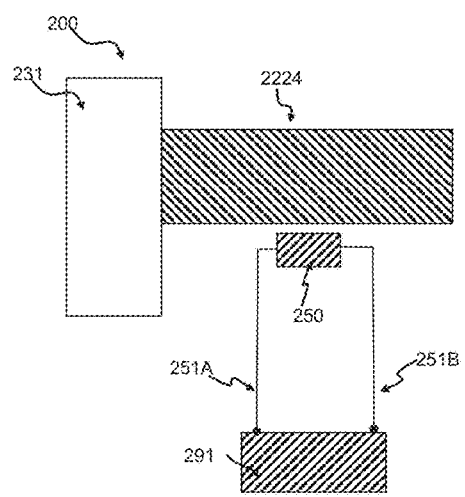
FIG. 3A General schematic of a DEVICE with adjustable transducer.
Figure 3B:
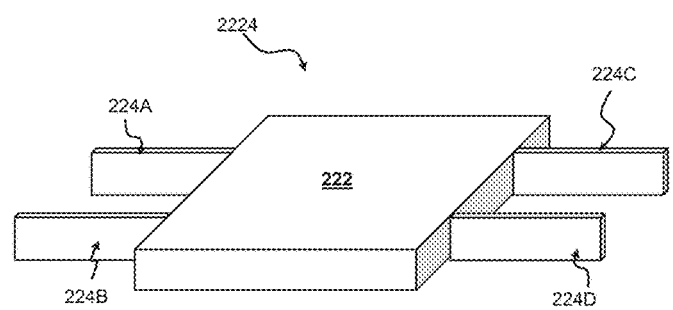
FIG. 3B is a schematic perspective view of a seismic mass supported by springs.

A general description of a DEVICE is shown in FIGS. 3A and 3B. The DEVICE 200 comprises a mass-spring system 2224 such that the spring is anchored to a support 231. An adjustable transducer 250 is coupled to the spring-mass system and its output terminals 251A, 251B are connected to an electric circuit 291. The Adjustable transducer 250 is associated with the mass movement directly or secondary effect such as strain generated in the spring as a result of the mass movement. Spring in FIG. 3A may a single spring or plurality of springs as shown in FIG. 3B where the spring is comprised of 4 springs 224A-224C.

Figure 4A:
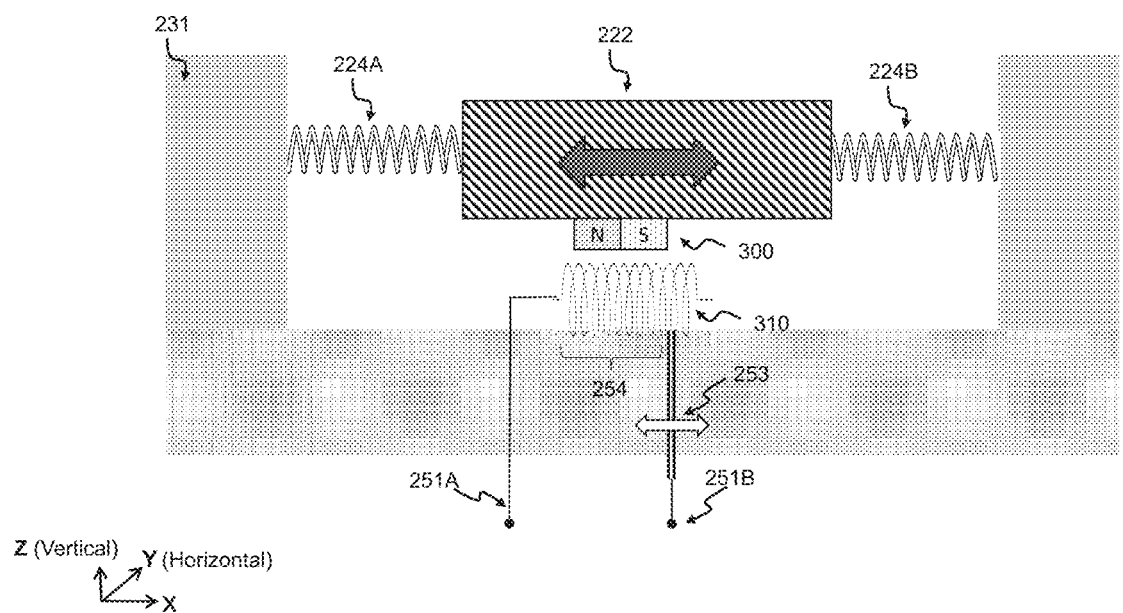
FIGS. 4a and 4b depict a schematic view of a DEVICE comprising an adjustable electromagnetic transducer.
Figure 4B:
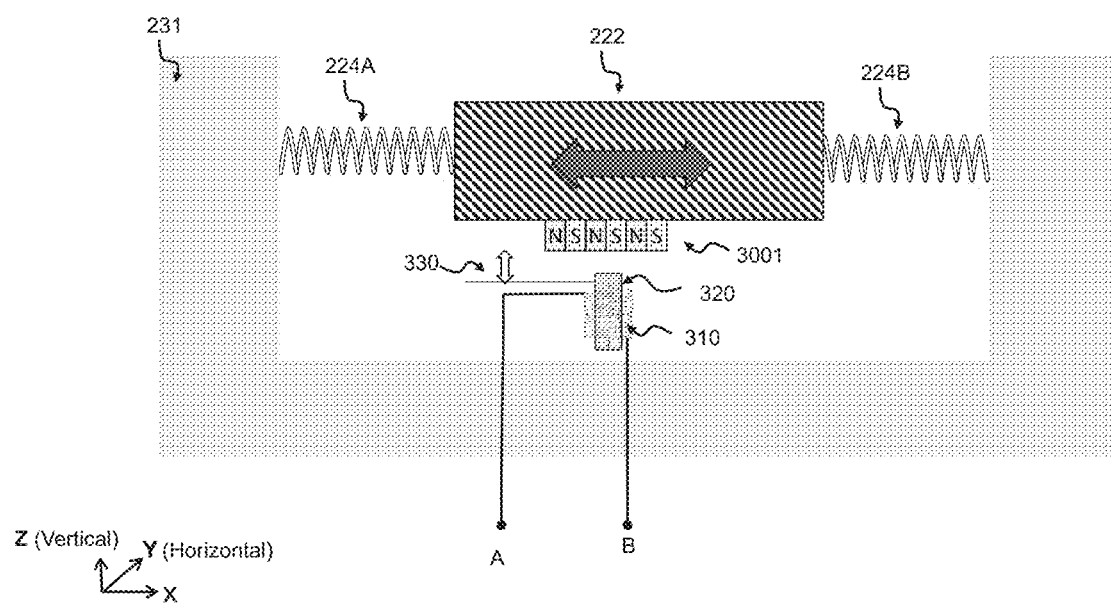

One example of such a DEVICE with adjustable transducer is shown in FIG. 4a and FIG. 4b. This DEVICE uses electromagnetic transducer such that the length of the inductor may be changed in order to control the overall induction. A seismic mass 222, is connected to a support 231 through springs 224A and 224B, that are free to move in the X direction. Magnet 300 is fixed to the seismic mass and an inductor 310 is placed at close proximity to the magnet such that the movement of the magnet induces current in the inductor (coil). In FIG. 4a the inductor terminals 251A and 251B are connected to an electric circuit such that terminal 251B is connected to a metal bar that can slide along the inductor coils such that the total number of coils may be selected such that the magnetic force generated by the current flowing in the coil that is applied on the seismic mass through the magnet can be controlled and such that the MEC may be adjusted and the conversion from mechanical energy to electric energy is optimized. FIG. 4b describes the DEVICE such that the inductor 310 is wrapped around a core 320. Magnet 3001 may be comprised of several N/S magnet fixed one next to each other such that movements of the seismic mass 222 induces an alternative magnetic field in the core and thus alternating current in the inductor. The magnetic force generated by the current flowing in the inductor and thus the MEC may be adjusted by changing the distance 330 between the core and the magnet such that the conversion from mechanical energy to electric energy is optimized.

Figures 5A, 5B:
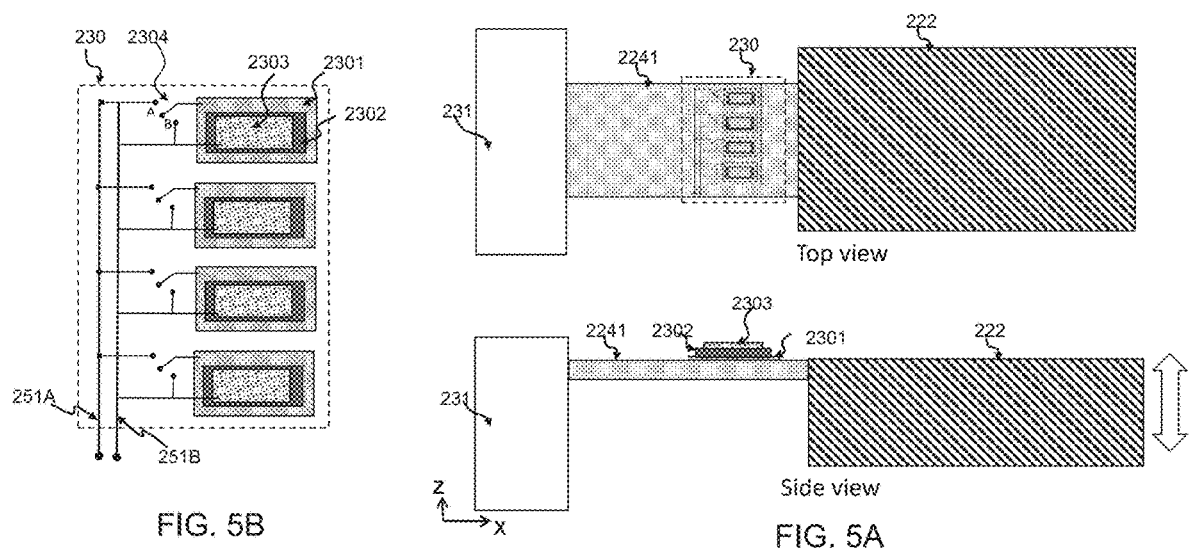
FIGS. 5A and 5B depict a schematic view of a DEVICE comparing an adjustable piezoelectric transducer made of an array of piezoelectric units that can be connected or disconnected.

Another example of a DEVICE with adjustable transducer is shown in FIG. 5A where a seismic mass 222 is connected to a support 231 through a bending spring 224. A piezoelectric transducer 230, comprised of array of piezoelectric units that are deposited along the bending spring preferably in location where the strain is the highest. FIG. 5B shows possible arrangement of the piezoelectric array with two terminals 251A and 251B that are connected to an external circuit (not shown). Each unit in the array is comprised of bottom electrode 2301, piezoelectric material 2302, and upper electrode 2303. The optimal power conversion may be achieved by adjusting the force applied by the piezoelectric transducer on the bending spring that adjusts the overall MEC of the piezoelectric transducer 230. This may be done by connecting or disconnecting electrode 2301 to terminal 251A with switch 2304 where in position A electrode 2301 is connected to terminal 251A and in position B the piezoelectric unit is shortened.

Figure 6A:
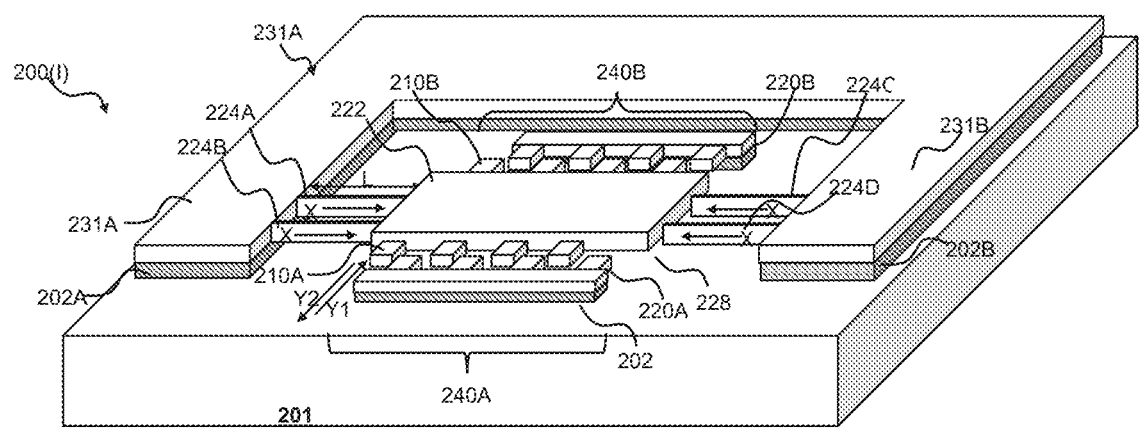
FIG. 6A is a schematic perspective view of a DEVICE, according to another embodiment.
Figure 6B:
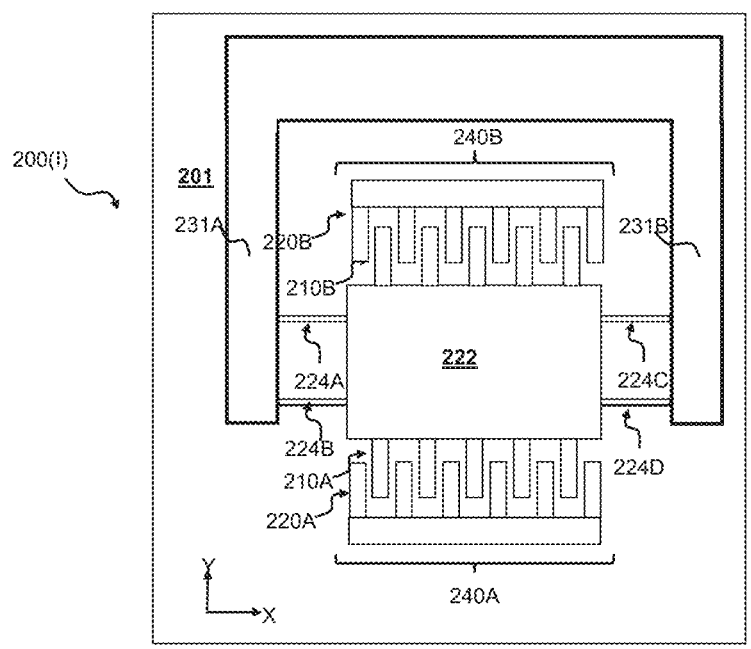
FIG. 6B is a schematic top plan view illustration of the DEVICE of FIG. 6A.
Figure 6C:
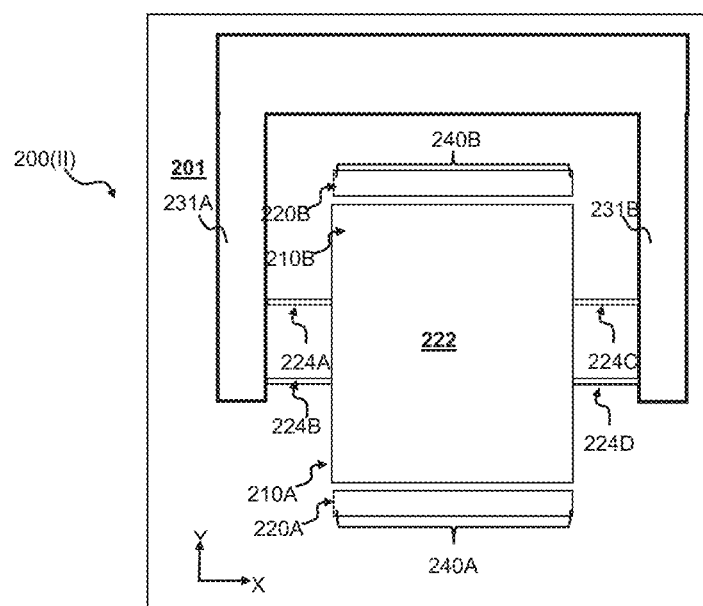
FIG. 6C is a schematic top plan view illustration of a DEVICE, according to an alternative embodiment.

Another example of a DEVICE with adjustable transducer is shown in FIGS. 6A-6C. Reference is made to FIG. 6A, which schematically illustrates a perspective of a DEVICE 200(I); and to FIG. 6B, which schematically illustrates a top planar view of DEVICE 200(I), according to the embodiment of FIG. 6A.

To simplify the discussion that follows, DEVICEs 200 (I)-200(III) are herein collectively referred to as DEVICE 200, unless the description refers to the operable differences resulting from the different coupling configurations of the electrode.

As shown schematically in FIGS. 6A and 6B, in an embodiment, with respective reference to a first side 240A and a second side 240B of DEVICE 200, first fixedly mounted electrodes 220A and 220B and oscillating electrodes 210A and 210B may be arranged in a laterally interlacing manner to form a comb-like structure, such that upon seismic mass movement in the Y direction the overlapping area of electrodes 210A and 220A and electrodes 210B and 220B changes.

FIG. 6C shows schematically another embodiment where electrode 210A is facing electrode 220A, and electrode 210B is facing electrode 220B such that when seismic mass 222 moves in the Y direction the gap between electrode 210A and 220A, and electrode 210B and 220B changes.

It should be noted that the number of first and second electrodes 210 and 220 shown in the accompanying figures is for exemplary purposes only and should by no means to be construed as limiting.

First electrodes 210 can be electrically charged, e.g., in a controlled manner. Second electrodes 220 are fixed and connected to an electrical circuit (not shown). To simplify the discussion that follows, without being construed limiting, the following description refers to a configuration in which the first electrodes are charged using a charging device, for example a FGCD, or a voltage source with isolating mean such as switch or fuse. Accordingly, in some embodiments, the charged electrodes may be fixedly mounted, while charge is induced in the circuit through the other, suspended electrodes. The term "selectively chargeable" refers to controlled and selective electric charging to a required level using a charging device.

First electrode 210 may be suspended in an isolated manner on a carrier wafer layer 201 to operably cooperate with second electrodes 220. The expressions "operably cooperate" or "operably mounted" as used herein with respect to "electrodes", as well as grammatical variations thereof, may refer to an arrangement in which the oscillating movement of one electrode relative to a second electrode, can induce electric current in an electrical circuit which is connected to the second electrode, when the first electrode is charged.

In an embodiment, the first and second electrodes may, for example, be manufactured using a Silicon-on-Insulator (SOI) wafer (e.g., a silicon carry wafer coated by layer of oxide and on top of it bonded silicon layer), or a Silicon on Glass (SOG) wafer, or using Spin On Glass technology for creating electrically isolated supports on a carry wafer.

The expression "electrically isolated" with respect to the "first electrodes" as used herein may refer to a state in which the first electrodes, under normal operating conditions, are electrically isolated from the wafer substrate, e.g., through an oxide layer unless the substrate is made of insulating material such as glass, and from the second electrodes by space. The space between the first and second electrodes may be in the range of several micrometers.

In an embodiment, first and second electrode may be made of a Single Crystal Silicon (SCS) on insulator carry wafer. Insulator carry wafer may for example be made of oxide on silicon wafer, glass wafer, Spin-On-Glass, and/or any other suitable material.

Charge may also leak from first electrode to the second electrode by avalanche backdown through the space between the electrodes and according to Paschen's law, or due to field emission. Lowering the pressure of the space between the first and second conductive electrodes will increase the backdown voltage that leads to such a leak and thus lower the risk of charge leakage. In all embodiments in this invention, it is assumed that the DEVICE may be packaged in low pressure, preferably as part of wafer level packaging.

It is noted that an electrode may be considered to be electrically isolated even when it can be charged using a FGCD using a proper tunneling setup, or by voltage source that may be electrically disconnected from the electrode for example by a switch or by a fuse.

In an embodiment, first and second electrodes 210 and 220 may lie in the same plane. Second electrodes 220 may be rigidly mounted onto electrically isolating island layers 202 (e.g., oxide layers) in a cantilevered manner so that a portion of each one of second electrodes 220 is extending from a proximal coupling area of the respective isolating island layers 202. The extension part may be suspended in air in order to reduce the overall supporting oxide. The same is true for the support 231 of first electrode 210, in general, as shown in FIG. 6A. Such a reduction in the supporting oxide area reduces the capacitance to the substrate and reduces the area through which charge may leak (through the oxide) to the substrate. Isolating island layers 202 overlay carrying wafer layer 201 that may be made of insulating material such as glass.

Figure 6D:
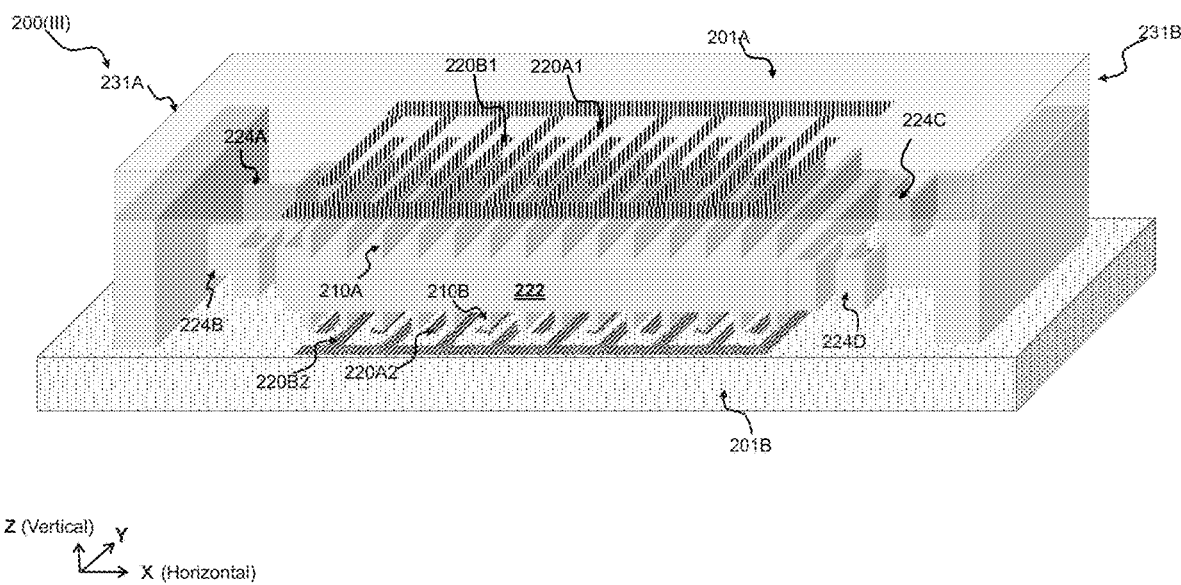
FIG. 6D is a schematic perspective view of a DEVICE, according to a yet other embodiment.

Reference is made to FIG. 6D which schematically illustrate DEVICE 200(III) showing another embodiment. An inertia element 222 that includes the first electrodes 210A and 210B, may oscillate along the X direction, coupled with a support 231A and 231B. Inertia element 222 and elements 210 are preferably made of conductive material and together have a center of gravity G. For example, first electrodes 210A may extend from an inertia element 222 so that a portion of each one of first electrodes 220 extends from the top and from the bottom planes of inertia element 222, towards the upper and lower layers 201A, 201B. Second electrode is shown made of two sets of electrodes such that one set, 220A1 and 220B1, is fabricated on the upper layer, 201A, and a second set, 220A1 and 220B1, is fabricated on the lower layer, 201B. Support 231 maybe physically fixed to bottom layer 201B, or it can be supported by upper layer or upper and lower layers, as shown in FIG. 6D. Bottom and upper layers, 201A and 201B may preferably be made of insulating material for example glass.

Figure 7C:
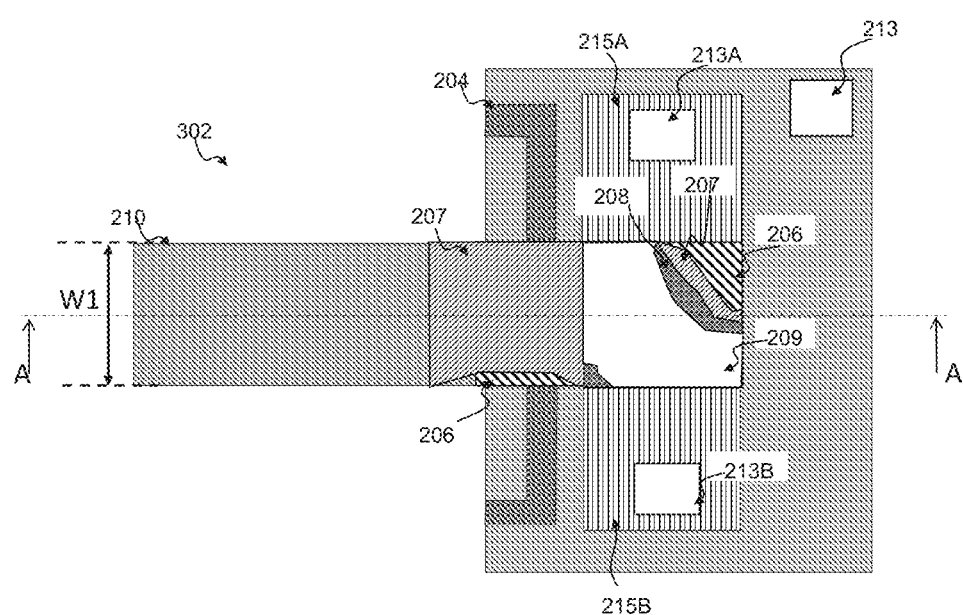
FIG. 7C is a schematic top plan view illustration of the FGCD shown in FIG. 7B.
Figure 8A:
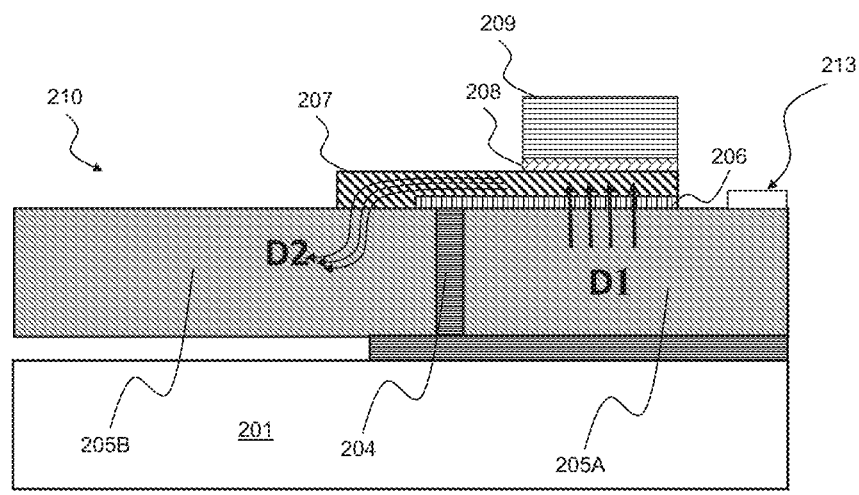
FIG. 8A is a schematic side view illustration of a FGCD and the electron tunneling path, according to an embodiment.

Reference is now made to FIG. 7A, which shows a schematic perspective side-view illustration of a first configuration of the FGCD 245-1A according to some embodiments; to FIG. 7B, which shows a schematic perspective front-view illustration of a second configuration of the FGCD 245-1B, according to some alternative embodiments; and to FIG. 7C which shows a schematic top plan view illustration of a charging arrangement 245-1B. Moreover, reference is also made to FIGS. 8A, FIG. 8B and FIG. 8C which shows the cross section A-A indicated in FIGS. 7A-7C, according to some embodiments; and to FIGS. 9A and 9B which shows a schematic plan top view illustration of yet another FGCD charging arrangement, according to an alternative embodiment.

Referring to FIG. 7A, charging arrangement 245-1A may comprise an island layer 202 on carrying wafer layer 201 and a conductive layer 203 partly connected to carrying wafer layer 201 through isolated layer 202 and partly suspended. Conductive layer 203 may be divided into a proximal conductive portion 205A and a distal conductive portion 205B by an isolating barrier 204 which extends perpendicularly from island layer 202 up to the upper surface of conductive layer 203. The distal conductive portion 205B may constitute electrode 210 (e.g., a silicon-electrode element), which may herein also be referred to as electrode 210. Some (e.g., the majority) but not all of distal conductive portion 205B may be suspended or cantilevered over the part of carrying wafer layer 201 which is not covered with isolating layer 202. The upper surface of isolating barrier 204 may be in substantially the same plane as the upper surfaces of proximal and distal conductive portions 205A and 205B.

A tunneling oxide layer 206 may overlay a part of proximal conductive portions 205A, extending entirely over the upper surface of isolating barrier 204 and further over a part of distal portion 205B such that some of the distal conductive portion 205B remains exposed. In an embodiment, the oxide beyond isolating barrier 204 (i.e. in a distal direction away from the FGCD structure) may be thicker than the tunnel oxide as no tunneling current flows beyond this point. Such a "thick" oxide may be required to improve isolation and reduce parasitic capacitance. Furthermore, a floating gate layer 207 may overlay tunnel oxide layer 206 and "spill over" the distal edge of tunnel oxide 206 to cover an additional area of the upper surface of distal conductive portion 205B, sufficiently to create a good electrical contact that will allow electrons to flow without much resistance.

On top of floating gate 207, a gate isolating layer 208 and a charging gate layer 209 are disposed. A reference pad 213 may be disposed over the proximal edge of the floating gate arrangement of tunnel layer 206 so that a voltage can be built up between distal gate layer 209 and reference pad 213, allowing the tunneling condition and electrons flow for charging the floating gate 207. It is noted that in this way the first electrode(s) can be considered to be charged "directly", since the floating gate of the FGCD is directly coupled to and integrally formed with the first electrode.

Floating gate layer 207 can for example be made of conductive material such that electrons tunneling into the floating gate will flow along it to conductive portion 205B.

As shown schematically in FIG. 7B, a charging arrangement 245-1B may include a Source 215A and Drain 215B with electrical pads 217A and 217B respectively. In some embodiments, source 215A and the drain 215B are doped silicon with doping type that is opposite to the substrate type. That is if the substrate is P type, the S and the D are N+ type. The "+" signs indicates that the material is highly doped. Numerals 205Ai and 205Aii indicate the left and right portions of the T-shaped FGCD arrangement. Numerals 204A and 204B indicate the right/left barrier portions of the floating gate arrangement. The shading in the Figures defining the Source and the Drain are for illustrative purpose only. As in the configuration shown in FIG. 7A, charging Gate 209 creates a tunneling path that allows electrons to flow from the substrate to the floating gate. By applying a voltage between the source and the drain, electrons flow along a conductive channel under the tunnel oxide. Some of these electrons, called "hot" electrons because of their kinetic energy, change their direction and tunnel to the floating gate such that the charging effect is enhanced compared to a process where the charging is done only by applying a gate voltage.

As shown schematically in FIG. 7C, a suspended electrode 210 may have a width W1 ranging, for example, from about 1 μm to about 2 μm, or of the order of several microns. Additional reference is made to FIG. 8A, which schematically illustrates the electron propagation path responsive to the application of a tunneling condition as a result of gate voltage. This description is also valid in case of hot electrons, in case of Source and Drain arrangement, and voltage is also applied between the source and the drain.

When a tunneling voltage is applied between gate 209 and the reference pad 213 and between the source and the drain (in case of a configuration that includes source and drain), electrons tunneled from proximal conductive portion 205A via tunneling oxide layer 206 charging floating gate layer 207 (schematically illustrated by arrow D1), and, further by diffusion, to distal conductive portion 205B of electrode 210 (as schematically illustrated by arrow D2).

Figure 8B:
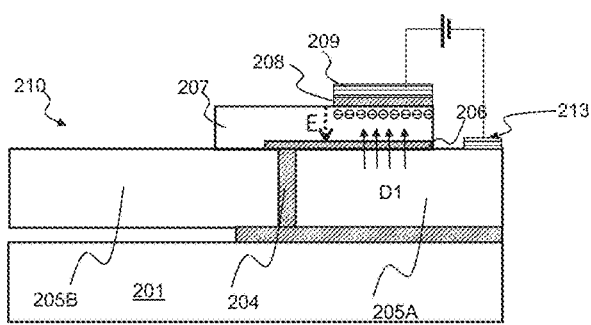
FIG. 8B is a schematic side view illustration of a charging arrangement showing a first charge distribution stage.
Figure 8C:
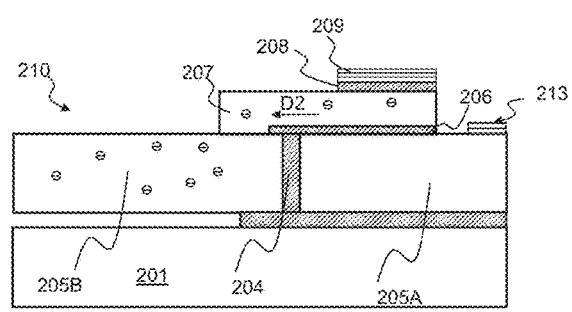
FIG. 8C is a schematic side view illustration of a charging arrangement showing a later, second charge distribution stage.

Reference is made to FIGS. 8B and 8C. Since the field between the charging gate and the substrate is limited to their overlapping area, the electrons may concentrate there as shown schematically in FIG. 8B. When the voltage is dropped to zero and the field vanishes, the electrons may diffuse to the floating gate extension and to electrode 210 as shown in FIG. 8C. When electrode 205B is at close proximity to a second electrode a capacitor is formed, and the charge may concentrate on the capacitor planes. In this case, the charging arrangement works as a charge pump, where each charging cycle pumps more electrons to charge electrode 210. The charge pulses may be very short so that the steps shown in FIGS. 8B and 8C may take less than a second.

Charge may be pumped (drained) out of the element by reversing the polarity of the charging gate voltage and by using a similar cycling method.

Figure 9A:
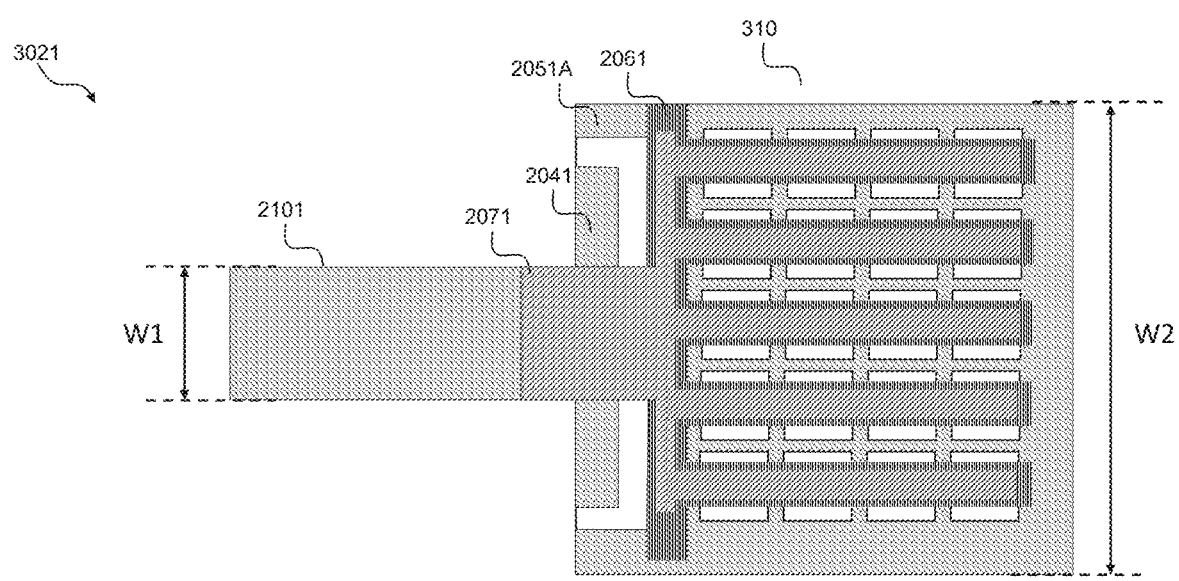
FIG. 9A is a schematic top plan view illustration of a FGCD arrangement, according a yet other embodiment.

Further reference is now made to FIG. 9A, which illustrates schematically a charging arrangement 3021 comprising a plurality of FGCD, 310, respective "sources" and "drains" of a floating gate extension and layer 2071 that are arranged and operable to enable the selective charging of a electrode 2101, through floating gate 2071 that extends to contact element 2101 according to some embodiments. In other words, a plurality of floating gates may be employed for charging a electrode. As shown schematically in FIG. 9A, there is practically no limitation on the width W2 of floating gate extension layer 2071. Width W2 can for example range from 0.5 μm to 100 μm or more. A barrier 2041 isolates a proximal conductive portion 2051A from electrode 2101.

Figure 9B:
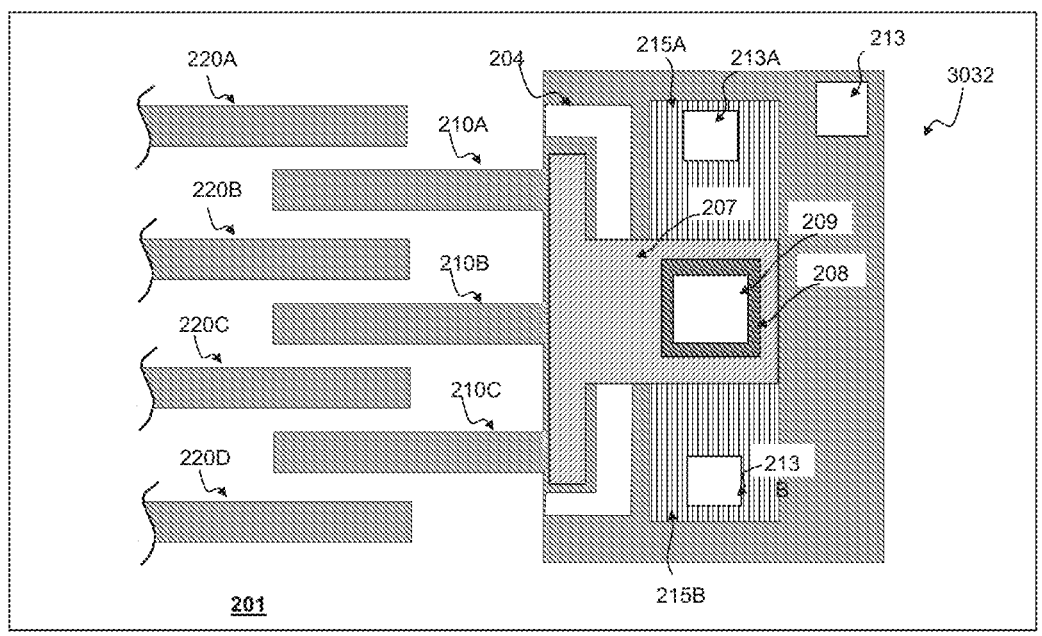
FIG. 9B is a schematic top plan view illustration of a FGCD charging arrangement, shown one floating gate charging device charging a plurality of first charged element according to another embodiment.

Further reference is now made to FIG. 9B, which illustrates schematically a charging arrangement 3032 comprising a plurality of first electrodes 210A-210C that are charged by one FGCD that includes a source and a drain.

Figure 10A:
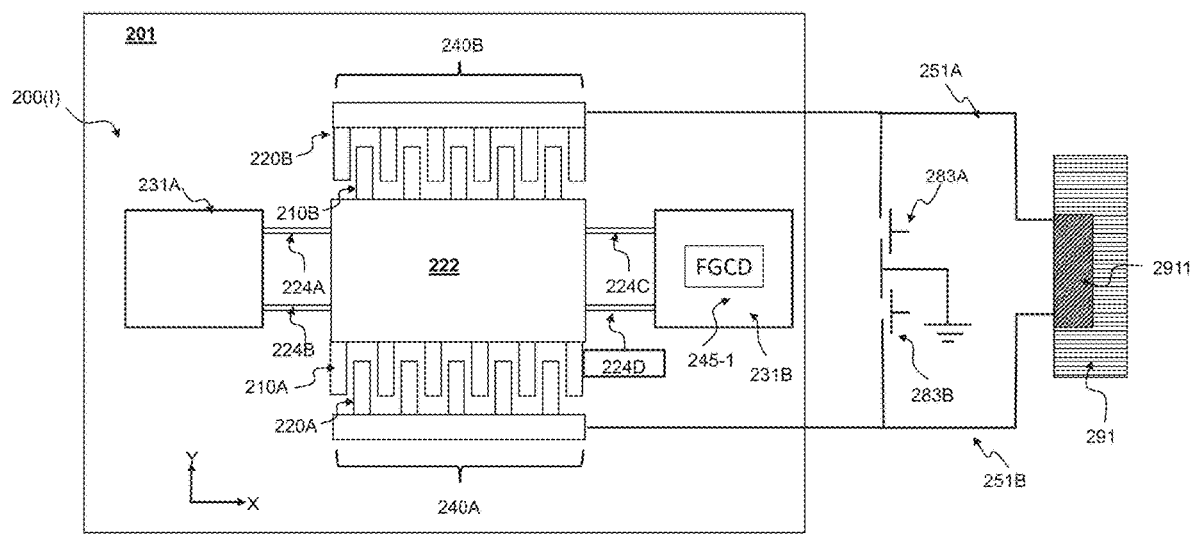
FIG. 10A is a schematic top plan view illustration of a DEVICE shown in FIG. 6B, where first electrode is charged using FGCD.
Figure 10B:
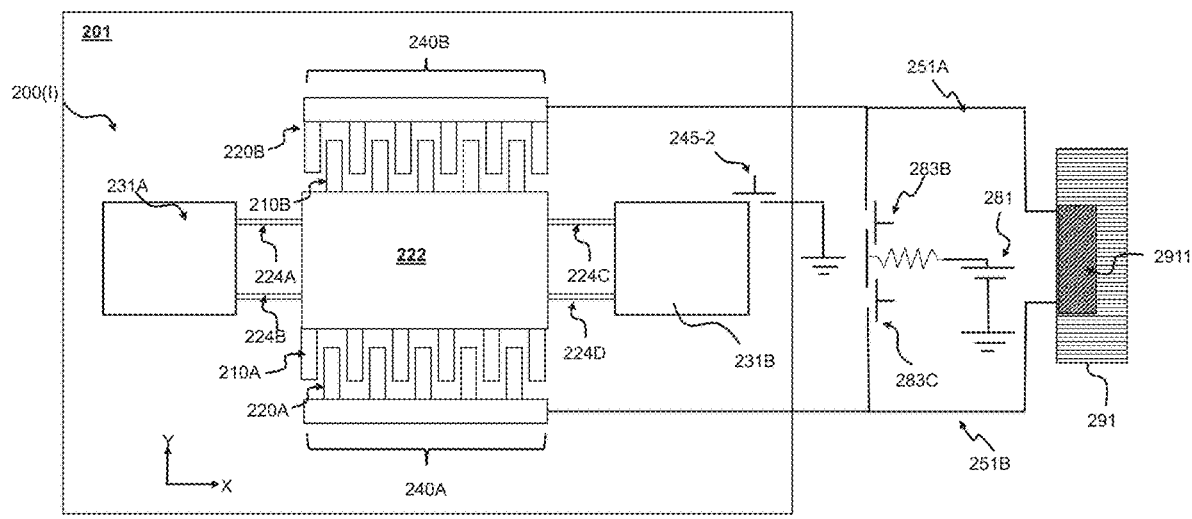
FIG. 10B is a schematic top plan view illustration of a DEVICE shown in FIG. 6B, where first electrode is charged using voltage source and is isolated using switch.
Figure 10C:
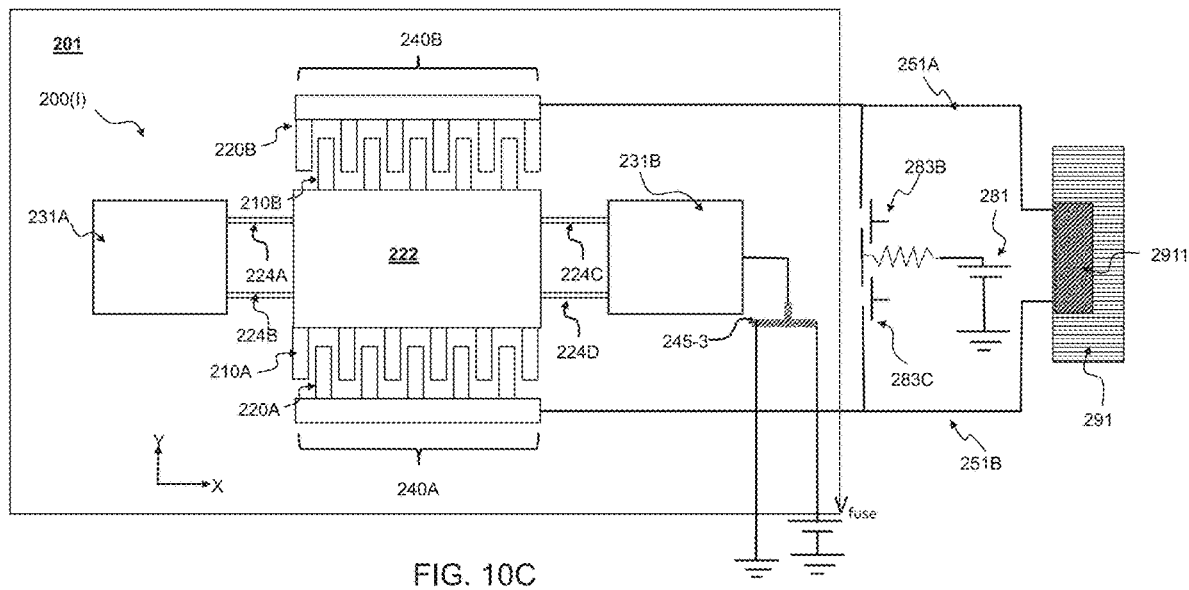
FIG. 10C is a schematic top plan view illustration of a DEVICE shown in FIG. 6B, where first electrode is charged using voltage source and is isolated using fuse.

Additional reference is made to FIGS. 10A-10C. FIG. 10A, schematically illustrates a DEVICE 200(I) shown in FIGS. 6A and 6B such that first electrode is connected to the floating gate of a FGCD, 245-1-1 such that charge in the floating gate, once charged, charges the capacitor formed between electrode 210 and 220. FGCD, 245-1-1 refers in general to FGCD, 245-1A or 245-1B shown in FIGS. 7A and 7B. It is noted that several FGCD may be used in parallel to charge up the first electrode. During charging cycle switches 283A and 283B are turned ON such that electrodes 220A and 220B are connected to the ground. During working mode switches 283A and 283B are turned OFF such that current generated in 220A and 220B flow into electric circuit 291.

In FIG. 10B the first electrode 210 of DEVICE 200(I) is charged by voltage source 281, through an isolating switch 245-2. During charging phase, switches 245-2, 283A and 283B are turned ON, voltage source 281 is on and the charge between electrodes 210 and 220 is set. During working mode switches 245-2, 283A and 283B, are turned OFF such that current generated in 220A and 220B flow into electric circuit 291. Switch 245-2 may be MEMS switch that is fabricated as part of the DEVICE.

In FIG. 10C the first electrode 210 of DEVICE 200(I), is charged by voltage source through fuse 245-3. During charging phase, switches 283A and 283B are ON, voltage source 281 is on and the charge between electrodes 210 and 220 is set. Once charge level is set $V_{fuse}$ is turned on and burns the electric path in fuse 245-3 and electrically disconnects electrode 210 such that electrode 210 is electrically isolated. During working mode switches 283A and 283B, are turned OFF such that current generated in 220A and 220B flow into electric circuit 291. Fuse 245-3 maybe fabricated as part of the DEVICE. It is noted that in the embodiment of FIG. 10C, the charge in first electrode may be set only once.

Figure 10D:
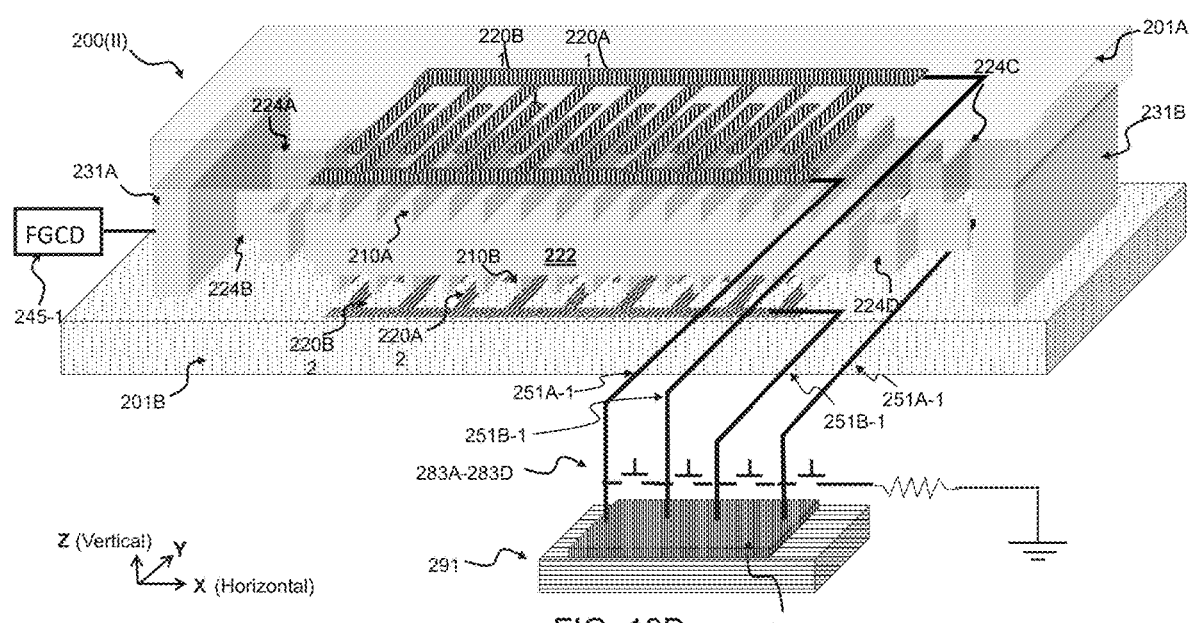
FIG. 10D is a schematic top plan view illustration of a DEVICE shown in FIG. 6D where first electrode is charged using FGCD.
Figure 10E:
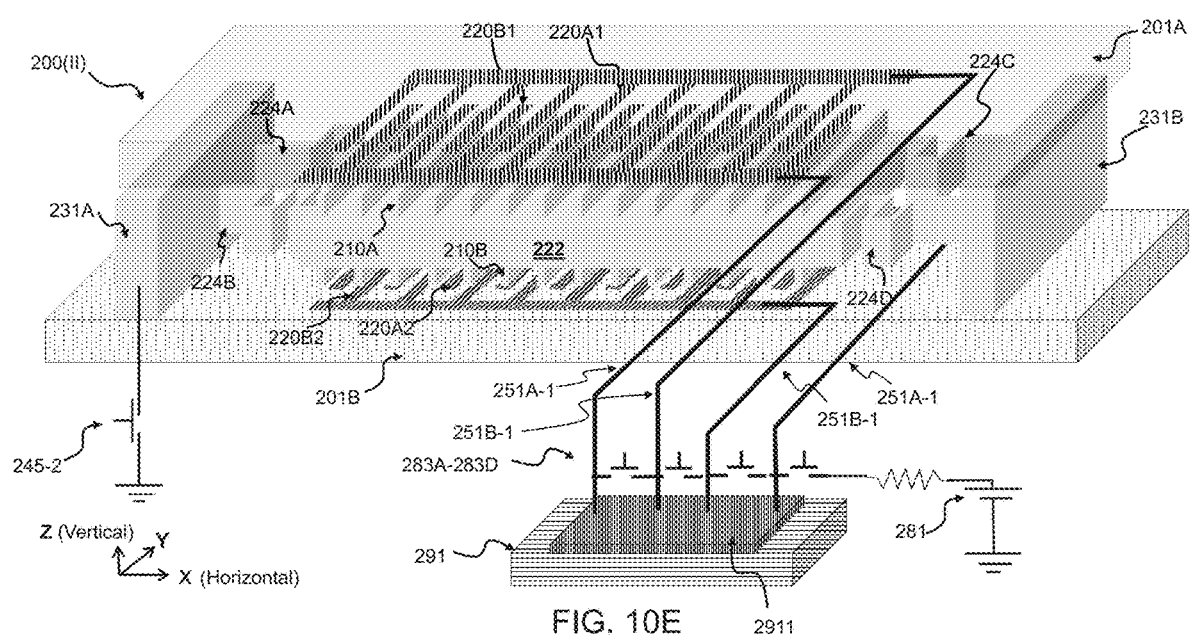
FIG. 10E is a schematic top plan view illustration of a DEVICE shown in FIG. 6D where first electrode is charged using voltage source and is isolated using switch.
Figure 10F:
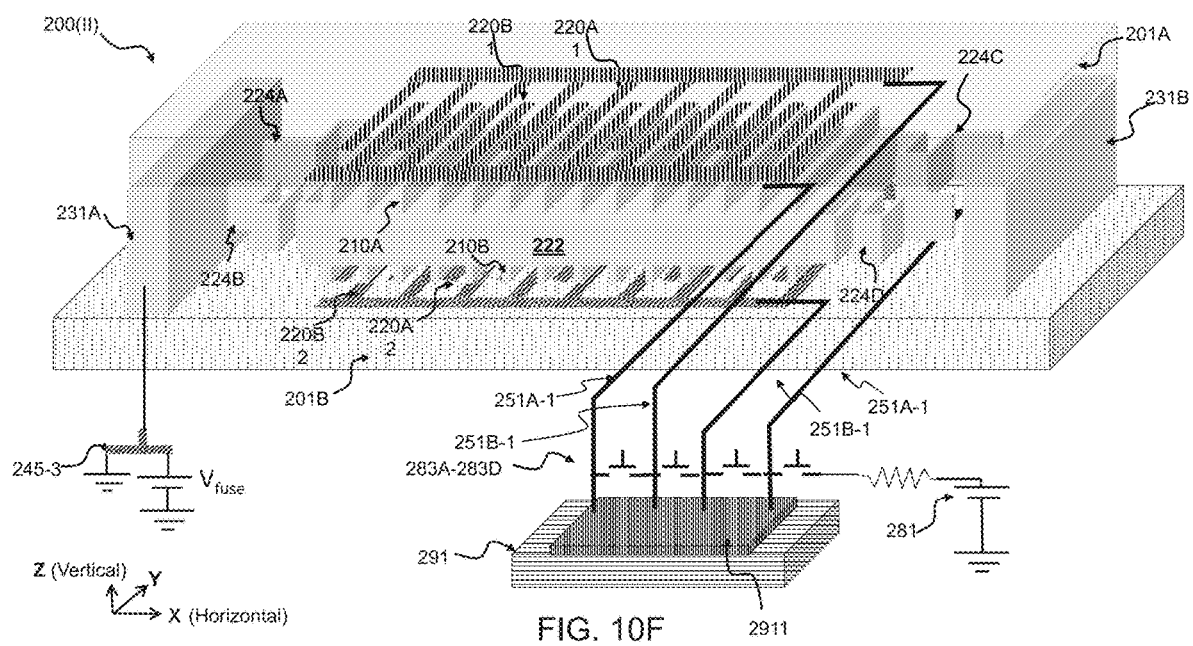
FIG. 10F is a schematic top plan view illustration of a DEVICE shown in FIG. 6D where first electrode is charged using voltage source and is isolated using fuse.

Additional reference is made to FIGS. 10D-10F that schematically illustrates a DEVICE 200(III) shown in FIG. 6D. In FIG. 10D the first electrode is connected to the floating gate of a FGCD 245-1. During charging cycle switches 283A-283D are ON such that electrodes 220B1, 220A1 on the upper layer 201A as well as electrodes 220B1, 220B2 on lower layer 201B are connected to the ground. Once FGCD 245-1 is charged, the charge charges the capacitor formed between electrode 210A, and electrodes 220B1 and 220A1, as well as between electrode 210B and electrodes 220B1 and 220B2. During working mode, switches 283A-283D are switched OFF and current generated in electrodes 220A1, 220A2, 220B1, 220B2, flow into electric circuit 291.

In FIG. 10E the first electrode of DEVICE 200(III), is connected to a voltage source 281. During charging cycle the voltage of the voltage source is set to a required level and switches 245-2, 283A-283D turned are ON such that electrodes 210A and 210B are connected to the ground and electrodes 220B1, 220A1 on the upper layer 201A as well as electrodes 220B1, 220B2 on lower layer 201B are connected to the voltage source 281. Once the charge between electrodes 220B1, 220A1 and electrodes 210A and between electrodes 220B1, 220B2 and electrodes 210B is set, switches 245-2, 283A-283D are turned OFF. During working mode, switches 245-2, 283A-283D are OFF and current generated in electrodes 220A1, 220A2, 220B1, 220B2, flow into electric circuit 291.

In FIG. 10F the first electrode 210 of DEVICE 200(III), is charged by voltage source through fuse 245-3. During charging phase, switches 283A-283D are ON, voltage source 281 is on and the charge between electrodes 220B1, 220A1 and electrodes 210A and between electrodes 220B1, 220B2 and electrodes 210B is set. Once charge level is set $V_{fuse}$ is turned on and burns the electric path in fuse 245-3 and electrically disconnects electrodes 210A and 210B such that electrodes 210A and 210B are electrically isolated. During working mode switches 283A-283D, are turned OFF such that current generated in 220A1, 220A2, 220B1, 220B2 flow into electric circuit 291. Fuse 245-3 maybe fabricated as part of the DEVICE. It is noted that in the embodiment of FIG. 10F, the charge in first electrode may be set only once.

Electric circuit 291 in FIGS. 10A-10E may be used to sense the movement of inertia mounded element 222, by measuring the current flowing in electrodes 220A and 220B (220A1, 220B1, 220A2, 220B2). Electric circuit 291 may also include power management circuit for manipulating the current flowing in electrodes 220A and 220B (220A1, 220B1, 220A2, 220B2). Such manipulation may include for example amplification. Electric circuit 291 may also include power management 410 and control circuit 400 shown in FIG. 11, for managing the charging level of the DEVICE.

Electric circuit 291 in FIGS. 10A-10E may be used to harvest the electric power flowing in electrodes 220A and 220B (220A1, 220B1, 220A2, 220B2). The electric circuit 291 may also include power management circuit that for example may include rectifying, up or down conversion. Electric circuit 291 may also include power management 410 and control circuit 400 shown in FIG. 11, for managing the charging of an energy storage device such as battery or super capacitor. Electric circuit 291 may also include an electric circuit for managing an energy storage device such as battery or super capacitor that are feed by the DEVICE.

Figure 11:
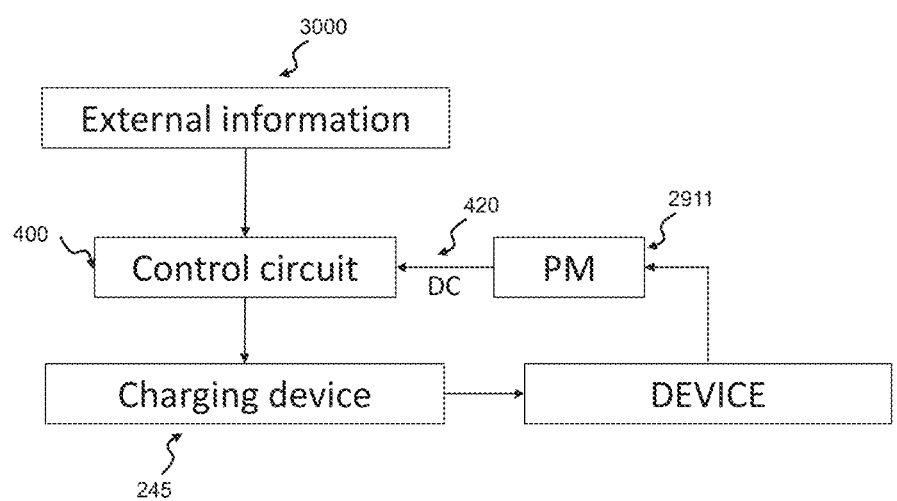
FIG. 11 is a block diagram illustration of a DEVICE with a controller for controlling transducer MEC properties, according to an embodiment.

Reference is now made to FIG. 11, which shows a block diagram for controlling the charge level of the first electrodes in the embodiment described in this invention. The control circuit may receive inputs from the energy harvester and from the surroundings. The input from the energy harvester may be, for example, the displacement amplitude of the inertia element (seismic mass), or/and the power output from the energy harvester. The input from the surrounding may be for example, the vibration amplitude of energy harvester, or/and the vibration frequency. The control circuit may include a procedure for finding the optimal charging level of the first electrode. The control circuit may use a controller or a special designed ASIC chip.

According to some embodiments, the selectively chargeable electrodes may be made of P-type or N-type semiconductor material. As well known, the majority mobile charge carriers in N-type semiconductors are electrons and in P-type semiconductors are holes. To keep the semiconductor material electrically neutral, the electrons and holes are balanced by (respectively) positive and negative ions. If P-type semiconductor material is employed, electrons that are tunneled to the electrodes may recombine with the holes thus leaving the material charged with negatively charged ions. As a consequence, charge is less likely to move and eventually leak out of the isolated electrode either through the tunnel oxide or through the outer surface of the charged electrode.

In some embodiments and as outlined herein below in more detail, a charging arrangement may in some embodiments, act as a chemical sensor. For example, a negatively charged first electrode 210 may attract positively charged ions and/or molecules.

Figure 12A:
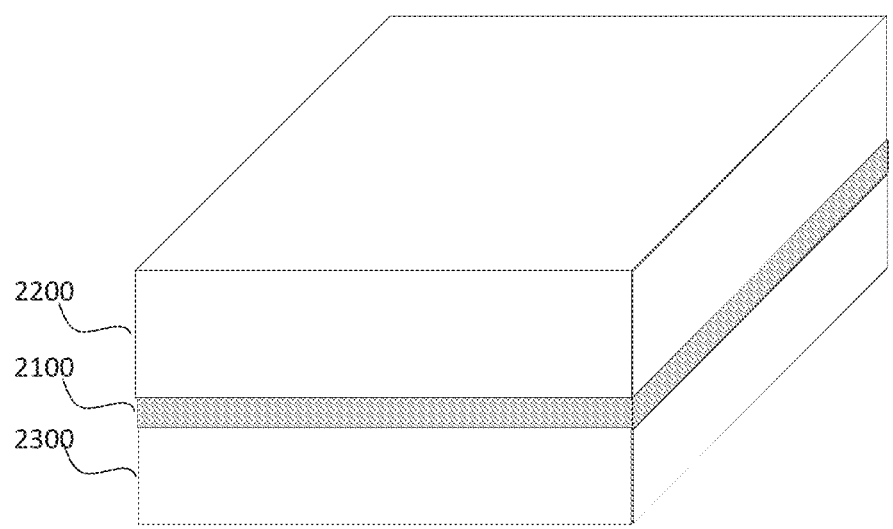
FIGS. 12A-12D, 12E(a), 12E(b), 12F and 12G describe different stages in a method for manufacturing a charging arrangement, according to an embodiment.

Reference is made to FIG. 12A. A method for manufacturing a charging arrangement may include providing a SOI wafer 2000 comprising a Between Oxide Layer (BOX) 2100 interposed between an upper silicon layer called the device layer 2200 and lower Silicon carrier wafer 2300.

Figure 12B:
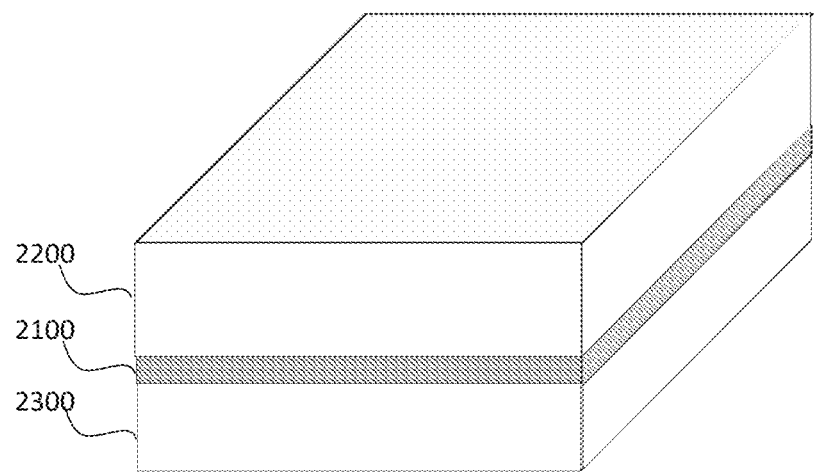
Figure 12C:
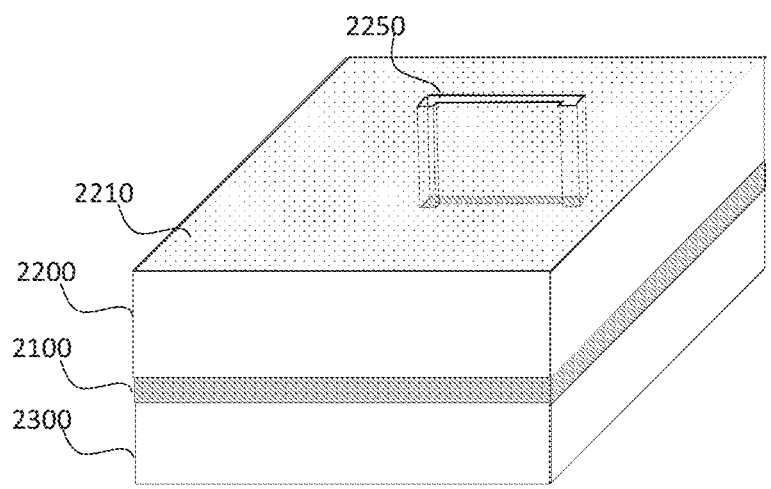
Figure 12D:
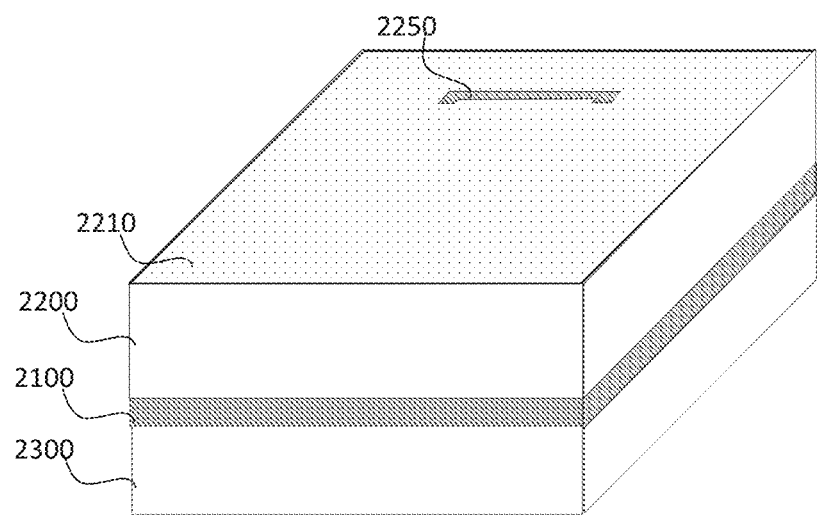
Figure 12E:
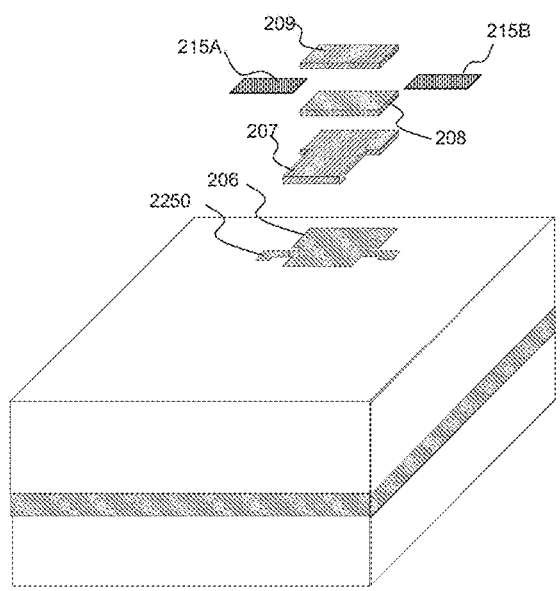
Figure 12E:
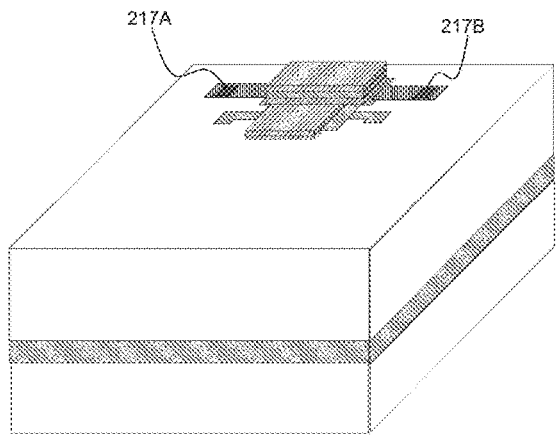

As shown schematically in FIG. 12B, the method may then include providing, e.g., a $Si_3N_4$ coating 2210 for preventing oxidation underneath it, as in FIG. 12E.

As shown schematically in FIG. 12C, the method may further include forming a U-shaped trench 2250 extending in wafer 2000 all across device layer 2200 down to the upper side of the oxide layer 2100, by employing for example photolithography for pattern transfer, which may be followed by, e.g., Deep Reactive Ion Etching (DRIE) of the device layer down to the oxide layer 2100.

As shown schematically in FIG. 12D, the method may include performing thermal oxidation of the wafer such that the inner surface of U-shaped trench 2250 is filled with oxide. It is noted that other filling materials may be used.

As shown schematically in FIG. 12E, the method may further include employing a manufacturing process for obtaining a FGCD that is integrated with first electrode 210.

FIG. 12E shows in (a) a breakdown of the process. The integrated FGCD process may include patterning the Si3N4 layer in FIG. 12E to expose Silicon and an oxidation step that oxidizes the exposed Silicon to form the tunnel oxide 206 such that oxidation extends beyond the insulating barrier 2250. Next the floating gate 207 is deposited and patterned such that it extends beyond the tunnel oxide 206 and makes an ohmic contact with the silicon beyond the tunnel oxide.

The use of insulating barrier 2250, and the specific patterning the tunnel oxide and the floating gate are unique to the proposed process and are not common in state of the art FGCD technology. Source 215A and Drain 215B steps may follow by doping the areas on the two sides of the floating gate. An insulating layer 208 and a charging gate 209 are deposited and patterned to complete the FGCD step.

The method may include deposition and patterning of pads 217A and 217B as shown in FIG. 12E (b). The pad metallization comes last in the FGCD process.

Figure 12F:
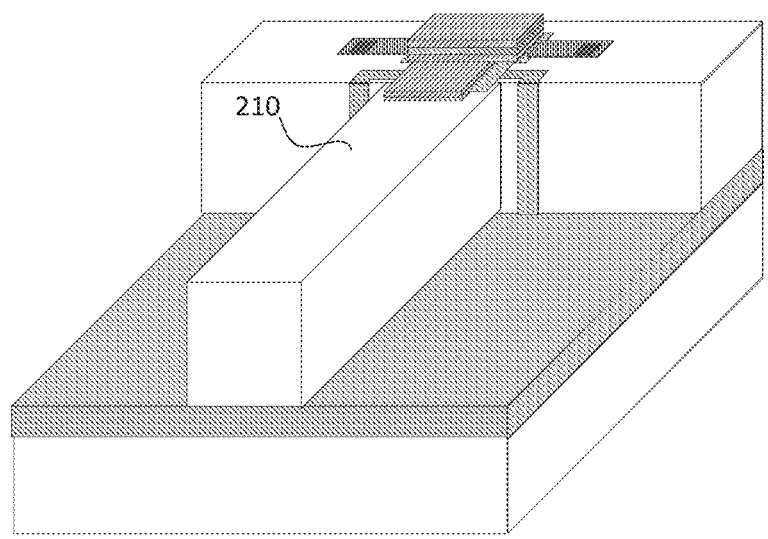

As shown schematically in FIG. 12F, the method may include employing photolithography, image transfer and DRIE down to the BOX such to obtain first electrode 210.

Figure 12G:
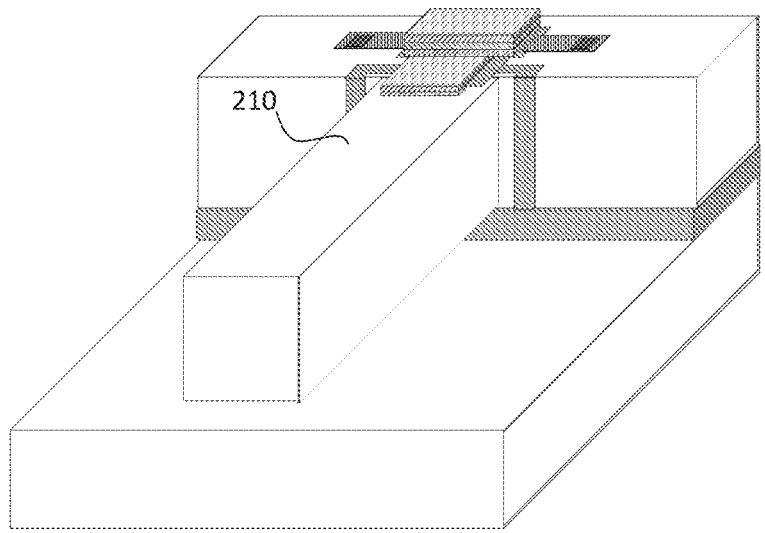

As shown schematically in FIG. 12G, the method may then include removal of the BOX.

Figure 13:
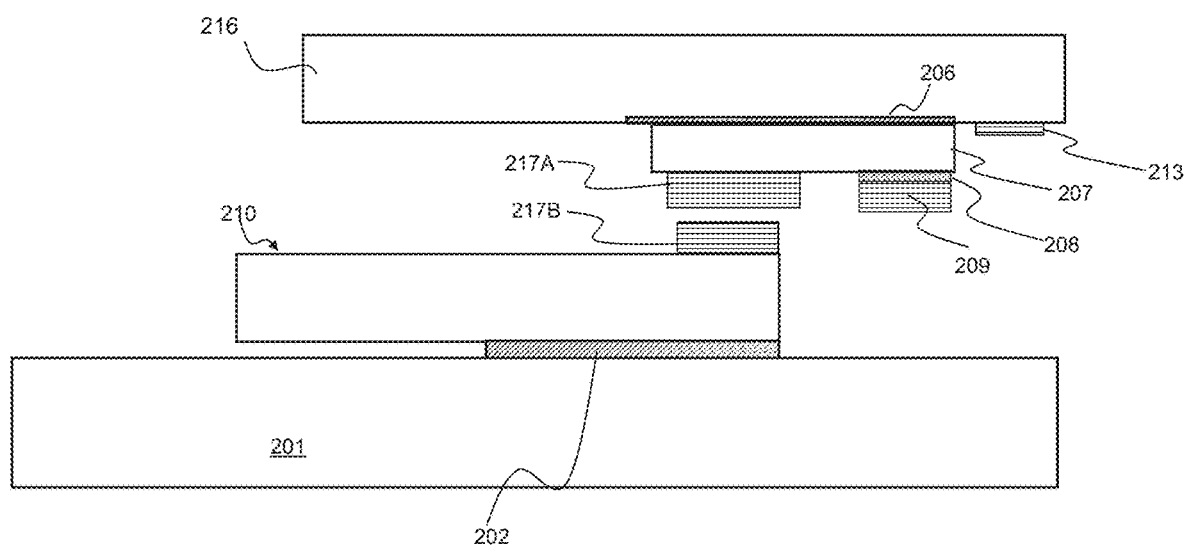
FIG. 13 describes another example of a fabrication process of a DEVICE, according to an embodiment.

Reference is now made to FIG. 13, which describes another example of a fabrication process of the DEVICE. FIG. 13 is a side view showing one first fixed electrode 210 fabricated in one wafer such as discussed in different embodiments. One floating gate charging device is fabricated on a second wafer 216. When the two wafers are bonded to each other, a contact such as eutectic contact, is formed between pads 217A and 217B, forming an electrical contact between the floating gate 207 and element 210.

Other processes may be used including, for example, a process that includes an etch from the back side of substrate 201, in selective places, all the way to oxide 202, followed by an etch of this oxide to release suspended elements 220. It is also noted that instead of using SOI wafers, Silicon on Glass (SOG) wafers may be used.

From the above, is it understood that the present invention refers to a device 200 for converting mechanical energy to electrical energy, comprising a mechanical device 2224 comprising a seismic mass 222 flexibly connected to a base 231 by at least one spring 224, a mechanoelectric transducer 250 associated with mechanical device for converting the mechanical energy to the electric energy, such that the mechanoelectric transducer is deigned to adjust its mechanoelectrical property to a desired level. The transducer is connected to an electric circuit 291 such that when the seismic mass moves relative to the base an electric current is generated in the electric circuit.

The device for converting mechanical energy to electrical energy as stated above wherein the mechanoelectric transducer comprises a first electrode 210 mounted on seismic mass and a second electrode 220 mounted on a support 201A, 201B, 240A, 240B; wherein first electrode is designed to be electrically charged by a charging device 245-1, 281; wherein the charging device is connected to the first electrode through an electric disconnecting mechanism 245-2, 285, 206; wherein the charging device is electrically connected to the first electrode only while charging; and wherein the first electrode is at close proximity to the second electrode.

The device for converting mechanical energy to electrical energy as stated above wherein the electrical disconnecting mechanism is a floating gate 245-1, or an electrical switch 245-2 or a fuse 245-3.

The device for converting mechanical energy to electrical energy as stated above, wherein the spring is a bending spring 2241 and wherein the mechanoelectric transducer comprises a plurality of piezoelectric transducers 230 fixed to bending spring; wherein one or more of the piezoelectric transducers are designed to be electrically connected to or disconnected from the electric circuit such that the MEC of the transducer may be modulated.

The device for converting mechanical energy to electrical energy as stated above, wherein the mechanoelectric transducer comprising a magnet 300 fixed to the seismic mass and an inductor 310 at close proximity to the magnet; wherein the inductor has two terminals 252A, 252B that are connected to the electric circuit; and wherein a connection 253 of one of the terminals 252B to the inductor is designed to slide along part 254 of the inductor such that the MEC of the transducer may be modulated.

The device for converting mechanical energy to electrical energy as stated above, that further includes a power management circuit 2911 for converting the electric current to DC power so that the device for converting mechanical energy to electrical energy can be used for energy harvesting.

The device for converting mechanical energy to electrical energy as stated above, that further includes a secondary electric circuit 400 for adjusting the desired level of the MEC such that the electric current can be adjusted. This device may further include a power management circuit 2911 that transform the electric current to a DC power source 420 for powering the secondary electric circuit.

The device for converting mechanical energy to electrical energy as stated above, wherein a value of the electric current is used to represent a movement of the device or to be used as an inertial sensor.

More specifically, we can say that the present invention refers to a device for converting mechanical energy to electrical energy, comprising: (a) a mechanical device comprising a seismic mass flexibly connected to a base by at least one spring, (b) a mechano-electric transducer that is associated with the mechanical device for converting mechanical energy of the seismic mass to electric energy, and (c) an electric circuit that is connected to the mechano-electric transducer in a way that electric current is generated in the electric circuit when the seismic mass moves relative to the base. The mechano-electric transducer is designed to adjust a force that the mechano-electric transducer can exert on the mechanical device and by that to control a conversion level of the mechanical energy to the electrical energy.

The mechano-electric transducer of the device as explained above may comprise a base electrode that is attached to said seismic mass and a pair of electrodes that are attached to a support, wherein the base electrode is at close proximity to the pair of electrodes; wherein said electric circuit that is connected to the pair of electrodes of the mechano-electric transducer in the way that said electric current is generated in the electric circuit when said seismic mass together with the base electrode moves relative to the pair of electrodes; a charging device that is connected to the base electrode through an electrical disconnecting mechanism; wherein said charging device is designed to charge the base electrode and by that to adjust a magnitude force that the pair of electrodes can exert on the base electrode in a way that change a movement of the base electrode together with the seismic mass relative to the pair of electrodes, and by that to control said conversion level of the mechanical energy to the electrical energy. The electrical disconnecting mechanism may be a floating gate, an electrical switch or a fuse.

The mechano-electric transducer of the device as explained above may also comprise a magnet fixed to said seismic mass and an inductor at close proximity to the magnet; wherein said electric circuit is connected to the inductor of the mechano-electric transducer by two terminals in the way that said electric current is generated in the electric circuit when said seismic mass together with the magnet moves relative to the inductor; wherein a connection of one of said terminals to the inductor is designed to slide along at least part of the inductor and to change the length of the inductor and by that to adjust magnitude force that a magnetic field induced by said electric current flowing in the inductor can exert on the magnet in a way that change a movement of the magnet together with the seismic mass relative to the inductor, and by that to control said conversion level of the mechanical energy to the electrical energy.

The mechano-electric transducer of the device as explained above may also a magnet fixed to said seismic mass and an inductor at close proximity to the magnet; wherein said electric circuit is connected to the inductor of the mechano-electric transducer by two terminals in the way that said electric current is generated in the electric circuit when said seismic mass together with the magnet moves relative to the inductor; wherein the distance between the magnet and the inductor may be adjusted and by that to adjust magnitude force that a magnetic field induced by said electric current flowing in the inductor can exert on the magnet in a way that change a movement of the magnet together with the seismic mass relative to the inductor, and by that to control said conversion level of the mechanical energy to the electrical energy.

The mechano-electric transducer of the device as explained above may also comprise piezoelectric transducers fixed to said spring; wherein said electric circuit is connected to the piezoelectric transducers in the way that said electric current is generated in the electric circuit when said seismic mass moves and bends the spring together with the piezoelectric transducers; wherein one or more of said piezoelectric transducers are designed to be electrically connected to or disconnected from the electric circuit and by that to change a deformation force that the piezoelectric transducers can exert on the spring of said mechanical device in a way that adjust bends of the spring and by that to control said conversion level of the mechanical energy to the electrical energy.

It should be understood that where the claims or specification refer to "a" or "an" element, such reference is not to be construed as there being only one of that element. In the description and claims of the present application, each of the verbs, "comprise" "include" and "have", and conjugates thereof, are used to indicate that the object or objects of the verb are not necessarily a complete listing of components, elements or parts of the subject or subjects of the verb. Unless otherwise stated, the use of the expression "and/or" between the last two elements of a list of options for selection indicates that a selection of one or more of the listed options is appropriate and may be made. It is noted that the term "perspective view" as used herein may also refer to an "isometric view".

It is appreciated that certain features of the invention, which are, for clarity, described in the context of separate embodiments or example, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

All references mentioned in this specification are herein incorporated in their entirety by reference into the specification, to the same extent as if each individual patent was specifically and individually indicated to be incorporated herein by reference. In addition, citation or identification of any reference in this application shall not be construed as an admission that such reference is available as prior art to the present application. It is further noted that the microfabrication processes described above are just examples of many possible process flows. In the discussion, unless otherwise stated, adjectives such as "substantially" and "about" that modify a condition or relationship characteristic of a feature or features of an embodiment of the invention, are to be understood to mean that the condition or characteristic is defined to within tolerances that are acceptable for operation of the embodiment for an application for which it is intended. Positional terms such as "upper", "low er" "right", "left", "bottom", "below", "lowered", "low", "top", "above", "elevated", "high", "vertical" and "horizontal" as well as grammatical variations thereof as may be used herein do not necessarily indicate that, for example, a "bottom" component is below a "top" component, or that a component that is "below" is indeed "below" another component or that a component that is "above" is indeed "above" another component as such directions, components or both may be flipped, rotated, moved in space, placed in a diagonal orientation or position, placed horizontally or vertically, or similarly modified. Accordingly, it will be appreciated that the terms "bottom", "below", "top" and "above" may be used herein for exemplary purposes only, to illustrate the relative positioning or placement of certain components, to indicate a first and a second component or to do both. Further, directional terms such as "upwards" and "downwards" as used herein may indicate relative movement. "coupled with" means "coupled with directly or indirectly". It is important to note that the method is not limited to those diagrams or to the corresponding descriptions. For example, the method may include additional or even fewer processes or operations in comparison to what is described herein.

What is claimed is:

1. A device for converting mechanical energy to electrical energy, comprising:
   a seismic mass flexibly connected to a base by at least one spring,
   a mechano-electric transducer that is associated with the seismic mass for converting mechanical energy of the seismic mass to electric energy,
   an electric circuit that is connected to the mechano-electric transducer in a way that electric current is generated in the electric circuit when the seismic mass moves relative to the base;
   wherein the mechano-electric transducer is designed to exerts force on the seismic mass that damps the mechanical energy of the seismic mass;
   wherein said mechano-electric transducer is designed to adjust said force that damps the mechanical energy of the seismic mass; and
   wherein said adjustment of said force enables a control of a conversion level of the mechanical energy to the electrical energy.

2. The device according to claim 1, wherein said mechano-electric transducer comprises a base electrode that is attached to said seismic mass and a pair of electrodes that are attached to a support, wherein the base electrode is at close proximity to the pair of electrodes;
- wherein said electric circuit is connected to the pair of electrodes in a way that said electric current is generated in the electric circuit when said seismic mass together with the base electrode moves relative to the pair of electrodes;
- wherein the mechano-electric transducer further comprises a charging device that is connected to the base electrode through an electrical disconnecting mechanism;
- wherein said charging device is designed to charge the base electrode and by that to adjust said force that the pair of electrodes exerts on the base electrode;
- wherein said adjustment changes a movement of the base electrode together with the seismic mass relative to the pair of electrodes, and enables a control of said conversion level of the mechanical energy to the electrical energy.

3. The device according to claim 2, wherein said electrical disconnecting mechanism is a floating gate, an electrical switch or a fuse.

4. The device according to claim 1 wherein said mechano-electric transducer comprising a magnet fixed to said seismic mass and an inductor at close proximity to the magnet;
- wherein said electric circuit is connected to the inductor by two terminals in a way that said electric current is generated in the electric circuit when said seismic mass together with the magnet moves relative to the inductor;
- wherein a connection of one of said terminals to the inductor is designed to slide along at least part of the inductor and to change the length of the inductor and by that to adjust said force that a magnetic field induced by said electric current flowing in the inductor exerts on the magnet in a way that change a movement of the magnet together with the seismic mass relative to the inductor, and by that enables a control of said conversion level of the mechanical energy to the electrical energy.

5. The device according to claim 1 wherein said mechano-electric transducer comprising a magnet fixed to said seismic mass and an inductor at close proximity to the magnet;
- wherein said electric circuit is connected to the inductor by two terminals in a way that said electric current is generated in the electric circuit when said seismic mass together with the magnet moves relative to the inductor;
- wherein a distance between the magnet and the inductor is designed to be adjusted and by that to adjust said force that a magnetic field induced by said electric current flowing in the inductor exerts on the magnet in a way that change a movement of the magnet together with the seismic mass relative to the inductor, and by that enables a control of said conversion level of the mechanical energy to the electrical energy.

6. The device according to claim 1 wherein said mechano-electric transducer comprising piezoelectric transducers fixed to said spring;
- wherein said electric circuit is connected to the piezoelectric transducers in a way that said electric current is generated in the electric circuit when said seismic mass moves and bends the spring together with the piezoelectric transducers;
- wherein one or more of said piezoelectric transducers are designed to be electrically connected to or disconnected from the electric circuit and by that to change a deformation force that the piezoelectric transducers exert on the spring in a way that adjust bends of the spring and by that enables a control of said conversion level of the mechanical energy to the electrical energy.

* * * * *